(12) United States Patent
Hongo et al.

(10) Patent No.: US 7,132,343 B2
(45) Date of Patent: Nov. 7, 2006

(54) METHOD AND APPARATUS FOR MANUFACTURING DISPLAY PANEL

(75) Inventors: Mikio Hongo, Yokohama (JP); Akio Yazaki, Yokohama (JP); Mutsuko Hatano, Kokubunji (JP); Hiroshi Saito, Fujisawa (JP); Makoto Ohkura, Fuchu (JP)

(73) Assignees: Hitachi, Ltd., Tokyo (JP); Hitachi Displays, Ltd., Hayano Mobara (JP)

( * ) Notice: Subject to any disclaimer, the term of this patent is extended or adjusted under 35 U.S.C. 154(b) by 221 days.

(21) Appl. No.: 10/753,157

(22) Filed: Jan. 8, 2004

(65) Prior Publication Data

US 2004/0164306 A1    Aug. 26, 2004

(30) Foreign Application Priority Data

Feb. 20, 2003    (JP)    ............................. 2003-042148

(51) Int. Cl.
*H01L 21/336*    (2006.01)
*H01L 21/76*    (2006.01)

(52) U.S. Cl. ...................................... 438/308; 438/795
(58) Field of Classification Search ................ 438/146, 438/149, 151, 308, 795
See application file for complete search history.

(56) References Cited

U.S. PATENT DOCUMENTS

| | | | |
|---|---|---|---|
| 5,706,076 A * | 1/1998 | Takeda | ........................ 355/53 |
| 6,713,323 B1 * | 3/2004 | Yamazaki et al. | .......... 438/146 |
| 2002/0031878 A1 | 3/2002 | Hara et al. | |
| 2002/0119609 A1 | 8/2002 | Hatano et al. | |
| 2004/0253838 A1 * | 12/2004 | Yamazaki et al. | .......... 438/795 |
| 2005/0023531 A1 * | 2/2005 | Shoji et al. | .................... 257/70 |

FOREIGN PATENT DOCUMENTS

| | | |
|---|---|---|
| JP | 2002-222959 | 8/2002 |
| JP | 2002-270505 | 9/2002 |
| JP | 2003-124136 | 4/2003 |
| JP | 2003-168645 | 6/2003 |
| JP | 2003-179068 | 6/2003 |

OTHER PUBLICATIONS

F. Takeuchi, et al., "Performance of poly-Si TFTs Fabricated by a Stable Scanning CW Laser Crystallization", TFT4-3, AM-LCD '01, pp. 251-254.

* cited by examiner

*Primary Examiner*—David S. Blum
(74) *Attorney, Agent, or Firm*—Antonelli, Terry, Stout and Kraus, LLP.

(57) ABSTRACT

The whole surface of an insulating substrate having an amorphous silicon film formed thereon is scanned/irradiated with a solid-state pulsed laser beam shaped linearly or rectangularly, to form a uniform fine poly-crystalline silicon film for forming a pixel region. The periphery of the pixel region is scanned/irradiated with a time-modulated continuous-wave solid-state laser beam formed linearly. Thus, a peripheral circuit region including a drive circuit is formed as a poly-crystalline silicon film with crystals growing up in the scanning direction. Pixel portion thin film transistors are produced in the uniform fine poly-crystalline silicon film, while a drive circuit or an interface circuit is produced in the peripheral circuit region. One of substrates of a display panel is formed thus. A display panel including transistors with uniform properties in the pixel portion and transistors with excellent properties in the peripheral circuit portion including the drive circuit is obtained.

5 Claims, 19 Drawing Sheets

(a)

(b)

(c)

(a)

(b)

(c)

(d)

(a)

(b)

(c)

(d)

(e)

(f)

(a)

(b)

(c)

(d)

(a)

(b)

(c)

METHOD AND APPARATUS FOR MANUFACTURING DISPLAY PANEL

BACKGROUND OF THE INVENTION

The present invention relates to a display panel, and particularly relates to a method and an apparatus for manufacturing a display panel in which an amorphous or poly-crystalline semiconductor film formed on an insulating substrate constituting the display panel is irradiated with a laser beam so as to be formed into a semiconductor film whose film quality is improved or whose crystal grains are enlarged, so that the properties of active devices such as thin film transistors both in a pixel region and in a peripheral circuit region can be optimized to display with high definition and high quality.

In a so-called active matrix display panel of a liquid-crystal display, an organic electro-luminescence display or the like, active devices such as thin film transistors formed out of a semiconductor film are disposed on one (active substrate or thin film transistor (TFT) substrate) of substrates constituting the panel. For example, in a liquid crystal panel in which liquid crystals are enclosed between two substrates preferably using glass, fused quartz or the like, a large number of pixels to be driven by thin film transistors formed out of an amorphous silicon film on the substrate are arrayed in a matrix, and the pixels are switched on/off by the thin film transistors so as to form a two-dimensional image. The thin film transistors for driving the pixels on the substrate are also referred to as "pixel transistors". Then, a display signal is supplied to the pixel transistors selected by a drive circuit (hereinafter also referred to as "driver circuit", whereas thin film transistors constituting the driver circuit are also referred to as "driver transistors") placed in the periphery (peripheral circuit portion) of the substrate. The display signal is applied to a pixel electrode connected to an output electrode of each of the selected pixel transistors. Thus, the pixels corresponding to the selected pixel transistors are lit.

Currently, the peripheral circuit including the driver circuit is typically mounted in the periphery of the pixel region (display region) of the substrate in the form of an integrated circuit chip. If the driver circuit can be formed in the peripheral circuit portion of the substrate together with the pixel transistors, a so-called system-in panel can be realized so that exponential reduction in manufacturing cost and improvement of reliability can be expected. In the present circumstances, however, the silicon film (semiconductor film) forming the active layer of transistors is so poor in crystallinity that the performance of thin film transistors represented by mobility is low. Thus, it is difficult to manufacture a circuit required to have a high speed and a high function. In order to manufacture such a high-speed and high-function circuit, high-mobility thin film transistors are required. In order to realize the high-mobility thin film transistors, it is necessary to improve the crystallinity of the silicon thin film.

As a method for improving the crystallinity, excimer laser annealing has got a lot of attention in the background art. According to this method, an amorphous silicon film (whose mobility is not higher than 1 $cm^2/Vs$) formed on an insulating substrate (hereinafter also referred to as "substrate" simply) of glass or the like is irradiated with excimer laser so that the amorphous silicon film is transformed into a poly-crystalline silicon film. Thus, the mobility is improved. However, in the poly-crystalline silicon film obtained by irradiation with excimer laser, the grain size is about several hundreds of nanometers and the mobility is about 100 $cm^2/Vs$. Thus, the poly-crystalline silicon film is deficient in performance to be applied to a driver circuit or the like for driving a liquid crystal panel.

As a solution to this problem, there has been proposed an annealing technique using continuous-wave laser as disclosed in F. Takeuchi et al. "Performance of poly-Si TFTs fabricated by a Stable Scanning CW Laser Crystallization", AM-LCD '01 (TFT4-3) or a technique in which a crystal nucleus generated by excimer laser is grown as a crystal with harmonics of a pulsed YAG laser as disclosed in JP-A-2002-270505.

SUMMARY OF THE INVENTION

In the conventional technique disclosed in the aforementioned document of F. Takeuchi et al., an amorphous silicon thin film formed on a glass substrate is scanned with second harmonics of a diode pumped continuous-wave $YVO_4$ laser so that a crystal is grown. Thus, the mobility beyond 500 $cm^2/Vs$ is obtained. When such a high mobility can be obtained, a driver circuit having sufficient performance can be formed so that a system-on panel can be realized. However, a currently commercially available apparatus for the second harmonic of the diode pumped continuous-wave $YVO_4$ laser used here has a low power up to about 10 W. Accordingly, in order to anneal the whole surface of a substrate, the throughput comes into a question. Further, due to successive irradiation with the continuous-wave laser beam, there occurs a phenomenon that the direction of crystal growth may go out of order or silicon fused out of the silicon thin film by heat accumulated in the substrate maybe agglutinated by surface tension so that the silicon thin film cannot exist as a uniform film.

On the other hand, in the conventional technique disclosed in the aforementioned document of JP-A-2002-270505, a pixel region and a peripheral circuit region of a substrate where an amorphous material layer (amorphous silicon film) is formed all over the surface are irradiated with an excimer laser beam so that a crystal nucleus is generated and grown as a crystal grain in the amorphous material layer. Then, only the peripheral circuit region is further irradiated with a pulsed beam of an LD (laser diode) pumped solid-state laser so that the crystal grain is grown. The excimer laser radiated to the pixel region indeed has a large output but harmful gas is used. Therefore, the running cost of the manufacturing apparatus including the cost for treating the harmful gas is stupendous. In addition, the excimer laser varies widely in energy per pulse so that the output and the energy density distribution vary with time. It is therefore difficult to anneal the whole surface of the substrate uniformly. As a result, thin film transistors formed out of a poly-crystalline silicon film formed by irradiation with an excimer laser beam vary widely in properties so that there is a limit to improve the quality of a display panel such as a liquid crystal display panel obtained finally using the thin film transistors.

It is an object of the present invention to solve the foregoing problems belonging to the background art. It is another object of the present invention to provide a display panel in which the properties required for thin film transistors in a pixel region and thin film transistors in a peripheral circuit region are attained respectively so that a high-quality display image can be obtained, a method for manufacturing the display panel, and an apparatus for manufacturing the display panel. That is, the thin film transistors (pixel transistors) in the pixel region are made uniform in properties all over the display region, while the thin film transistors (driver transistors) in the peripheral circuit region are improved in mobility. Thus, the thin film transistors are made to have properties suitable to their functions respectively. A substrate having a pixel circuit and a driver circuit formed out of such thin film transistors is used as an active substrate so as to construct a display panel. In addition, a system-in panel having such a pixel region and such a peripheral circuit portion is realized with the running cost of the manufacturing apparatus being reduced while the throughput is secured.

In order to attain the foregoing objects, a display panel according to the present invention includes an active substrate having a pixel region and a peripheral circuit portion. The pixel region is annealed with a solid-state pulsed laser beam so that pixel transistors are formed out of a poly-crystalline silicon film trued up in properties. The peripheral circuit portion is annealed with an LD pumped solid-state pulsed laser beam and then irradiated with a time-modulated LD pumped continuous-wave laser beam so that driver transistors are formed out of a poly-crystalline silicon film having substantially the same performance as a single crystalline one.

In addition, in order to attain the foregoing objects, according to the present invention, using a manufacturing apparatus including a laser annealing apparatus, a pixel region on a substrate is irradiated with a solid-state pulsed laser beam so as to form a poly-crystalline silicon film trued up in properties, while a region where a peripheral circuit including a drive circuit should be formed is irradiated with the solid-state pulsed laser beam and then irradiated with a time-modulated solid-state continuous-wave laser beam. Thin film transistors are produced in the semiconductor film processed thus. As a result, pixel transistors are formed in the pixel region out of the poly-crystalline silicon film trued up in properties, while driver transistors are formed in the peripheral circuit portion out of the poly-crystalline silicon film superior in properties and having substantially the same performance as a single crystalline one. Thus, a display panel can be manufactured with the running cost of the manufacturing apparatus being reduced while sufficient throughput is secured.

The manufacturing apparatus having the laser annealing apparatus includes a pixel region annealing station using an LD pumped solid-state pulsed laser as a laser source, and a peripheral circuit portion annealing station provided for a peripheral circuit portion including a drive portion and using an LD pumped continuous-wave laser as a laser source. Both the stations are coupled by a substrate conveying portion which can be isolated from the atmosphere in accordance with necessity.

In addition, a display panel according to the present invention includes a pixel region and a peripheral circuit portion including a drive circuit. The pixel region is made from a uniform fine poly-crystalline film manufactured by use of the aforementioned manufacturing apparatus including the laser annealing apparatus and by application of the aforementioned laser annealing method. The peripheral circuit portion is made from a high-performance silicon thin film manufactured likewise.

Incidentally, the present invention is not limited to the aforementioned configurations and the configurations which will be described in the following embodiments of the invention. Not to say, various applications and modifications, including liquid crystal display panels, organic electroluminescence display panels, and other display panels to be driven actively, can be made without departing from the technical idea of the present invention.

As described above, according to the present invention, the pixel region where a pixel portion should be formed is irradiated with only a Q-switch-pulsed solid-state laser beam. Thus, transistors which do not have very much high performance represented by mobility but have performance required for switching pixels and have properties trued up can be formed in the pixel region. On the other hand, the peripheral circuit portion including the drive circuit is irradiated with a time-modulated continuous-wave solid-state laser beam. As a result, a silicon film having crystal grains growing up largely in the scanning direction of the laser beam independently of the history of the silicon film can be obtained. Thus, transistors having performance high enough to form the drive circuit can be formed in the peripheral circuit portion.

All the steps of annealing are carried out using a solid-state laser beam as a heat source. Accordingly, it is possible to reduce the running cost required for carrying out excimer laser annealing in the background art. Further, transistors operating at a high speed can be formed on a glass substrate. Accordingly, it is possible to realize an active substrate including a drive circuit, an interface circuit, and so on, that is, a so-called system-on panel (also referred to as "system-in panel"). Thus, a high-quality display panel using the active substrate can be obtained. In addition, a display panel having a pixel region and a peripheral circuit portion can be provided with the running cost of the manufacturing apparatus being reduced while the throughput is secured.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF PREFERRED EMBODIMENTS

Embodiments of the present invention will be described below in detail with reference to the drawings of the embodiments. Incidentally, first, an embodiment of a manufacturing method and a manufacturing apparatus will be described in order to make it easy to understand the invention.

Figure 1:
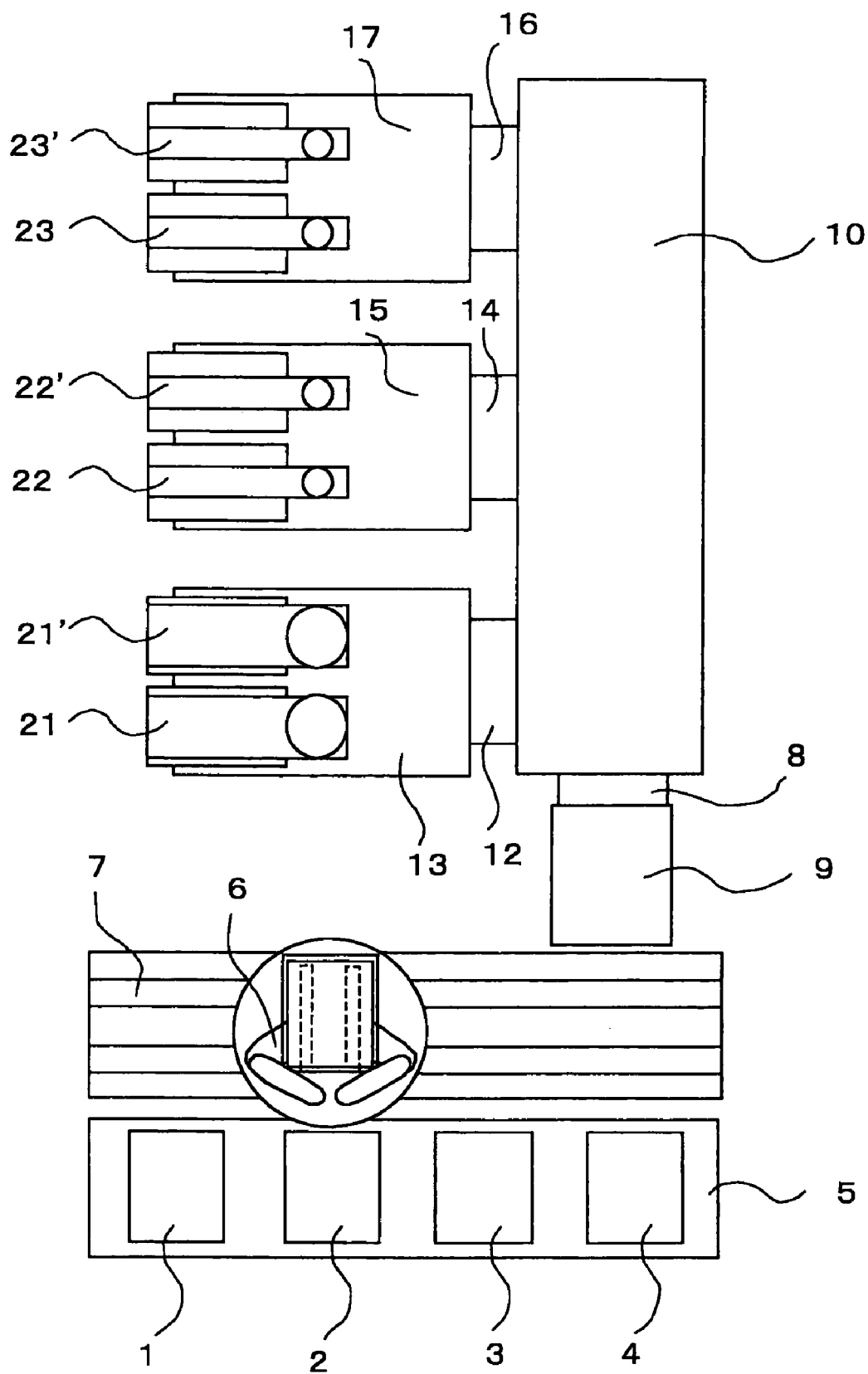
FIG. 1 is a schematic view showing the whole configuration of a laser annealing apparatus to which a first embodiment of a method for manufacturing a display panel according to the present invention is applied.

FIG. 1 is a schematic view showing the whole configuration of a laser annealing apparatus constituting a manufacturing apparatus to which a first embodiment of a method for manufacturing a display panel according to the present invention is applied. This laser annealing apparatus is constituted by a cassette mounting base 5 on which a plurality of cassettes 1, 2, 3 and 4 for receiving insulating substrates (hereinafter, using glass substrates and also referred to as "substrates" simply) will be installed, a robot 6 for conveying a substrate between the cassette 1, 2, 3 or 4 and a load lock chamber 9, a travel area 7 of the robot 6, the load lock chamber 9, a conveyance chamber 10 coupled with the load lock chamber 9 through a gate valve 8, a pixel region (hereinafter also referred to as "pixel portion") annealing chamber 13 coupled with the conveyance chamber 10 through a gate valve 12, drive circuit portion (hereinafter also referred to as "peripheral circuit region") annealing chambers 15 and 17 coupled with the conveyance chamber 10 through gate valves 14 and 16 respectively, pixel portion annealing laser irradiation optics 21 and 21' installed in the pixel portion annealing chamber 13, and drive circuit portion annealing laser irradiation optics 22, 22' and 23, 23' installed in the drive circuit portion annealing chambers 15 and 17 respectively. Incidentally, the pixel portion occupies a large part of the central region of the substrate, while the drive circuit portion is located in a region outside the pixel portion and along the outer circumference of the substrate.

Figure 2:
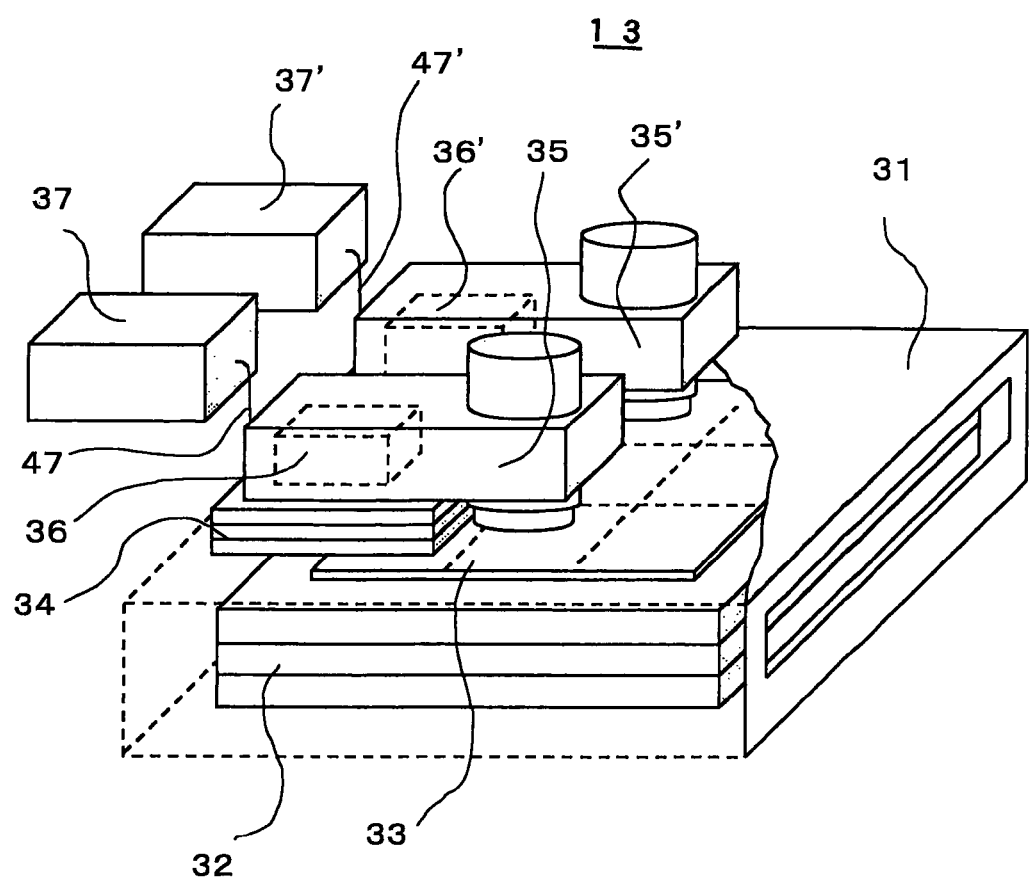
FIG. 2 is a perspective view typically showing an example of the configuration of a pixel portion annealing chamber in FIG. 1.

FIG. 2 is a perspective view typically showing an example of the configuration of the pixel portion annealing chamber in FIG. 1. In the pixel portion annealing chamber 13, a chamber 31, optics housings 35 and 35', and LD power supplies 37 and 37' are installed. A so-called XY stage 32 having a substrate 33 mounted internally is placed inside the chamber 31. The optics housings 35 and 35' are placed above the chamber 31 through a position adjustment mechanism 34 so that their positions can be adjusted in XYZ directions (length wise direction X, crosswise direction Y and height direction Z). The LD power supplies 37 and 37' include pumping LDs. The LD power supplies 37 and 37' placed outside the optics housings 35 and 35' are connected with solid-state laser oscillators 36 and 36' through optical fibers 47 and 47' respectively. The solid-state laser oscillators 36 and 36' are placed in the optics housings 35 and 35' respectively.

Figure 3:
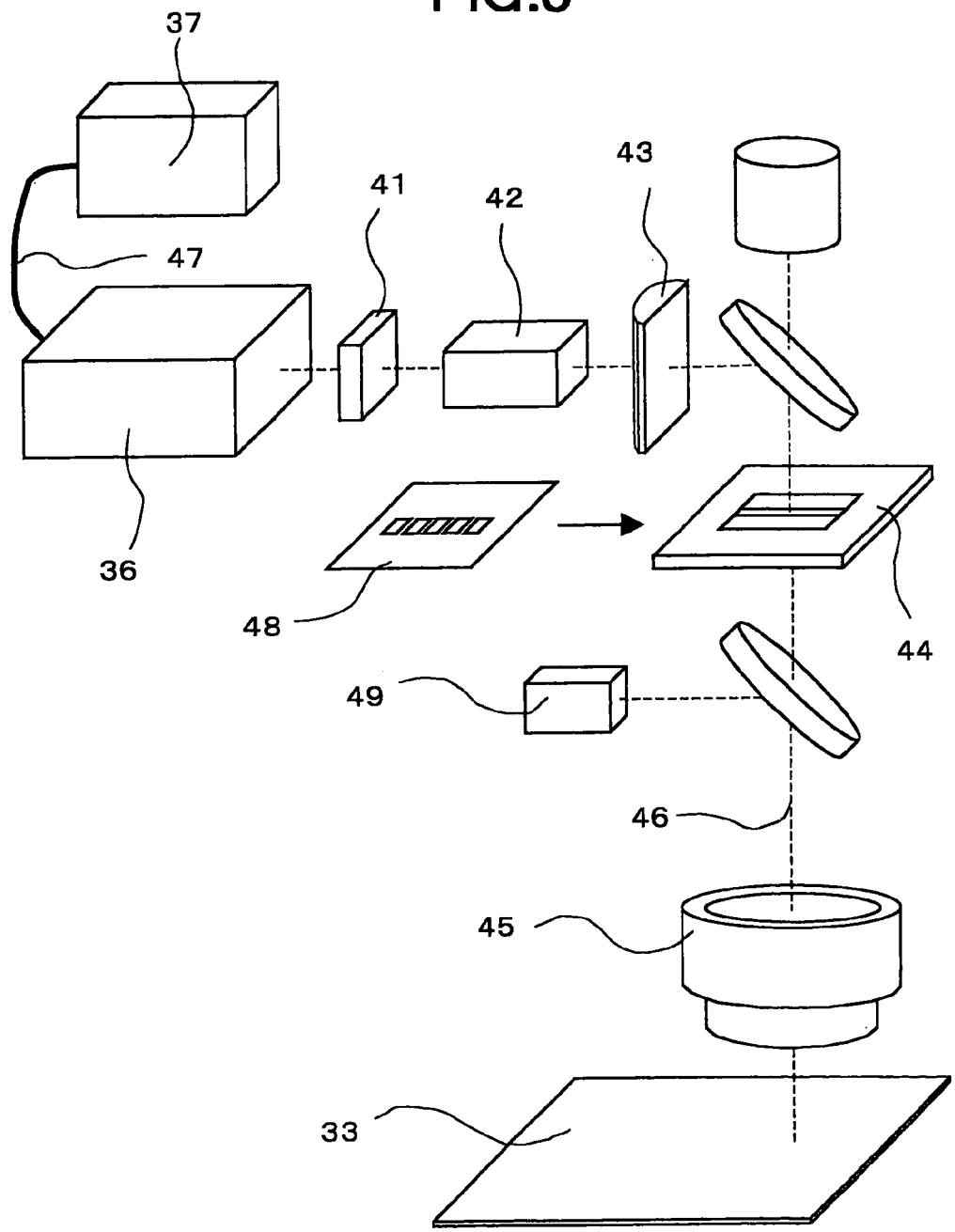
FIG. 3 is a perspective view showing the configuration of a pixel portion annealing optics of the laser annealing apparatus according to the first embodiment of the present invention.

FIG. 3 is a schematic view for explaining an example of the configuration of a pixel portion annealing laser irradiation optics in FIG. 1. The pixel portion annealing laser irradiation optics 21' have the same configuration as that of the pixel portion annealing laser irradiation optics 21. Here, the pixel portion annealing laser irradiation optics 21 will be described representatively. As shown in FIG. 3, the pixel portion annealing laser irradiation optics 21 is constituted by a solid-state laser oscillator 36 for oscillating a laser beam 46 for annealing the pixel portion of a substrate, a variable transmittance filter 41, a beam-homogenizer 42, a cylindrical lens 43, a variable rectangular slit 44, a removable mask 48, an objective lens 45, and an observational CCD camera 49. The pixel portion annealing laser irradiation optics 21 is received in the optics housing 35. The solid-state laser oscillator 36 is coupled with an LD placed in the pumping power supply 37 through the optical fiber 47 so as to be excited therewith.

Figure 4:
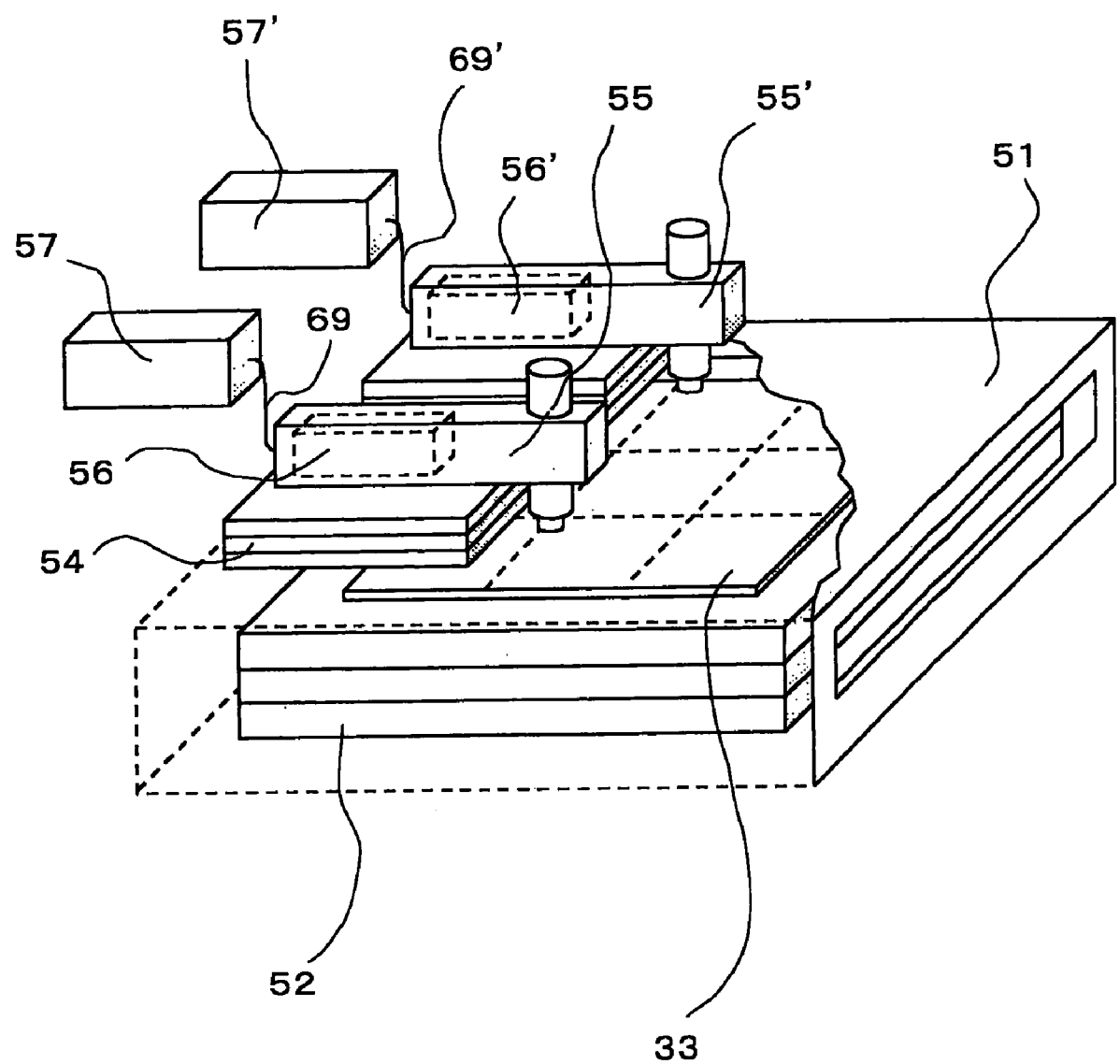
FIG. 4 is a perspective view typically showing the configuration of a drive circuit portion annealing chamber constituting the laser annealing apparatus, of annealing chambers in FIG. 1.

FIG. 4 is a perspective view typically showing the configuration of a drive circuit portion annealing chamber constituting the laser annealing apparatus, of the annealing chambers in FIG. 1. As shown in FIG. 4, each drive circuit portion annealing chamber 15, 17 is constituted by a chamber 51, optics housings 55 and 55' and LD power supplies 57 and 57'. Inside the chamber 51, an XY stage 52 mounted with the substrate 33 is installed. Each optics housing 55, 55' is placed above the chamber 51 through a position adjusting mechanism 54 so that the position of the optics housing 55, 55' can be adjusted in the XYZ directions. Each LD power supply 57, 57' including a pumping LD is placed outside the optics housing 55, 55' and coupled with a solid-state laser oscillator 56, 56' placed in the optics housing 55, 55' through an optical fiber.

Figure 5:
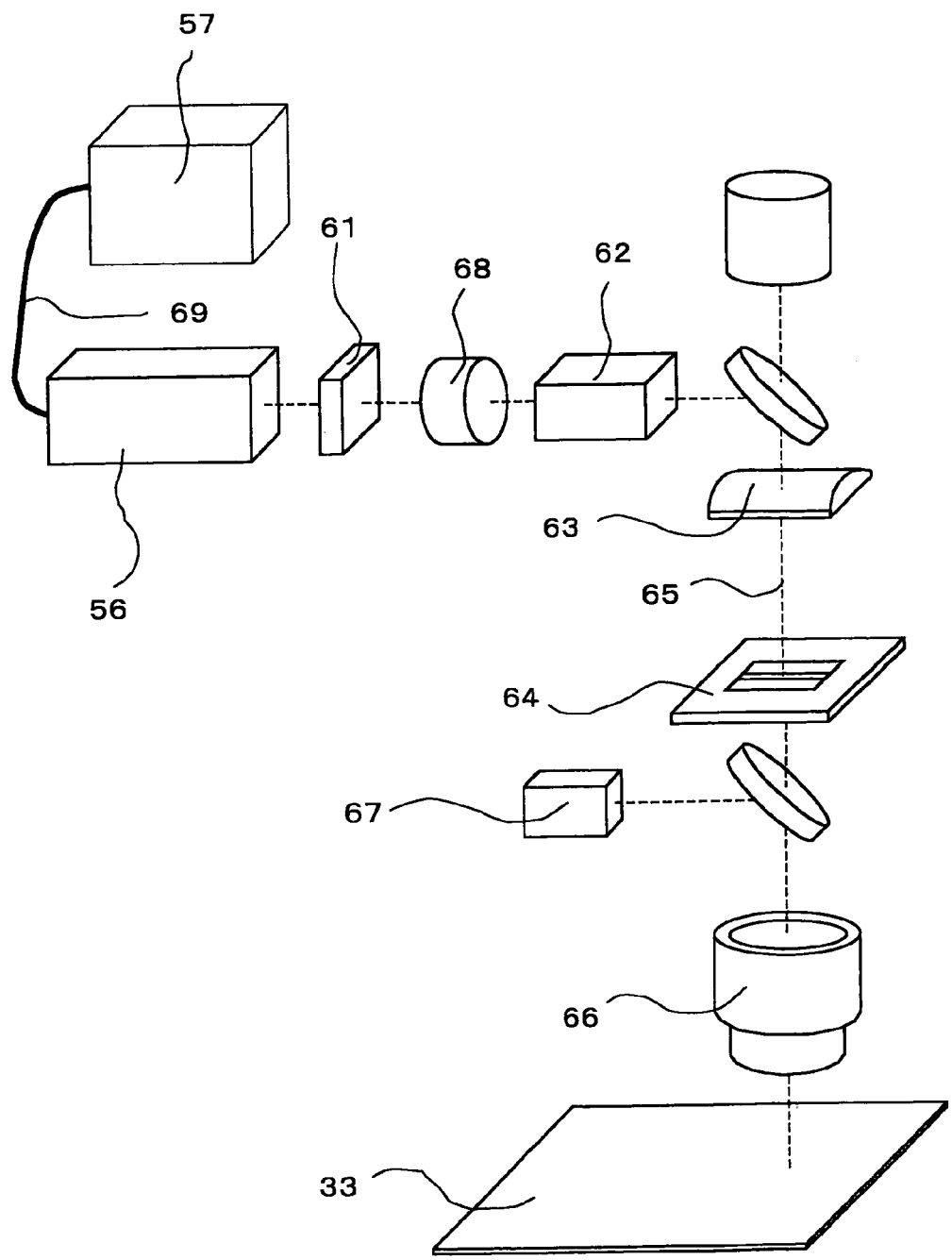
FIG. 5 is a schematic view for explaining the configuration of a drive circuit portion annealing laser irradiation optics in FIG. 1.

FIG. 5 is a schematic view for explaining the configuration of the drive circuit portion annealing laser irradiation optics in FIG. 1. The drive circuit portion annealing laser irradiation optics 22' and 23' have the same configurations as those of the drive circuit portion annealing laser irradiation optics 22 and 23. Here, the drive circuit portion annealing laser irradiation optics 22 and 23 will be described representatively. As shown in FIG. 5, the drive circuit portion annealing laser irradiation optics 22, 23 is constituted by a solid-state laser oscillator 56 for oscillating a laser beam 65 for annealing a peripheral circuit portion including a drive circuit, a variable transmittance filter 61, an electro-optical modulator 68, a beam-homogenizer 62, a cylindrical lens 63, a variable rectangular slit 64, an objective lens 66, and an observational CCD camera 67. The drive circuit portions annealing laser irradiation optics 22, 23 are received in the optics housing 55, 55'. The solid-state laser oscillator 56 is coupled with an LD placed in the pumping power supply 57 through an optical fiber 69 so as to be excited therewith.

Next, the operation of the laser annealing apparatus according to this embodiment will be described with reference to FIGS. 1 to 5. First, the cassette 1 receiving substrates is mounted on the cassette mounting base 5. Here, in the substrate, an insulating film of $SiO_2$ or SiN or a composite film of those insulating films 50–400 nm thick has been formed on a glass substrate 0.3–1.0 mm thick, and an amorphous silicon film 30–150 nm thick has been formed thereon. The transfer robot 6 picks up one substrate from the cassette 1, travels in the travel area 7, and mounts the substrate into the load lock chamber 9. In the load lock chamber 9, a door (cover) for retaining air tightness is placed to be able to be opened and closed in accordance with necessity. The substrate mounted in the load lock chamber 9 is passed through the gate valve 8 and moved through the conveyance chamber 10. Passed through the gate valve 12, the substrate is mounted on the stage 32 in the pixel portion annealing chamber 13. The conveyance chamber 10 has an airtight structure for retaining the substrate in a specific atmosphere during laser annealing in accordance with necessity.

When the specific atmosphere is in a vacuum, reduced-pressure or increased-pressure state, the conveyance chamber 10 has to have a structure proof against such a pressure. When the pressure is substantially equal to the atmospheric pressure, and a specific gas atmosphere is merely retained in the conveyance chamber 10, it is not necessary to take the pressure difference into consideration. In addition, when such a specific atmosphere is not required, the conveyance chamber 10 may be replaced by a simple conveyance mechanism. In such a case, the gate valves 8, 12, 14 and 16 are dispensable, and the load lock chamber 9 may be replaced by a simple substrate delivery mechanism.

The substrate 33 mounted on the stage 32 is positioned, and then irradiated, through a not-shown optical window, with the laser beams 46 from the solid-state laser oscillators 36 and 36' excited by the outputs of the LDs received in the LD power supplies 37 and 37', the outputs being transmitted via the optical fibers 47 and 47', respectively. Thus, the substrate 33 is annealed. Further, this operation will be described in detail with reference to FIG. 3. The power of the laser beam 46 oscillated from the solid-state laser oscillator 36 is adjusted by the variable transmittance filter 41. The laser beam 46 is then converted into a beam having a uniform energy density by the homogenizer 42. Then, the beam is compressed into one direction by the cylindrical lens 43 so as to be shaped to be linear (or zonal). An unnecessary portion is removed from the beam by the rectangular aperture slit 44. Thus, through the objective lens 45, at least a region (pixel region) of the substrate 33 where a pixel portion will be formed is irradiated with the beam as a projected image of the rectangular aperture slit 44.

Here, an LD pumped solid-state laser by which a pulsed beam can be obtained is used as the laser oscillator 36. More specifically, it is desired to use second harmonics (wavelength: 532 nm), third harmonics (wavelength: 355 nm) or fourth harmonics(wavelength: 266 nm) of an LD pumped Q-switch-pulsed YAG laser or an LD pumped Q-switch-pulsed $YVO_4$ laser. Of them, the second harmonics are the most suitable in terms of the magnitude and stability of output. As for the pulse width, a pulse having a width of 5–200 ns or more can be used. In consideration of the object of the present invention, it is desired to use a pulse having a width of 50 ns or more, preferably a pulse of a width of 200 ns or more.

The substrate 33 subjected to laser irradiation required for annealing at least the pixel portion (pixel region) is passed through the gate valve 12, moved through the conveyance chamber 10, passed through the gate valve 14 or 16, and mounted on the stage 52 in the drive circuit portion annealing chamber 15 or 17. The substrate 33 mounted on the stage 52 is positioned, and then irradiated, through a not-shown optical window, with the laser beams 65 from the solid-state laser oscillators 56 and 56' excited by the outputs of the LDs received in the LD power supplies 57 and 57', the outputs being transmitted via the optical fibers 69, respectively. Thus, the substrate 33 is annealed.

Further, this operation will be described in detail with reference to FIG. 5. The power of the laser beam 65 oscillated from the solid-state laser oscillator 56 is adjusted by the variable transmittance filter 61. The laser beam 65 is then time-modulated by the electro-optical modulator 68 so that a required change can be obtained at required timing. The time-modulated beam is converted into a beam having a uniform energy density by the homogenizer 62. Then, the beam is compressed into one direction by the cylindrical lens 63 so as to be shaped to be linear (or zonal). An unnecessary portion is removed from the beam by the rectangular aperture slit 64. Thus, through the objective lens 66, a region of the substrate 33 where a peripheral circuit including a drive circuit will be formed is irradiated with the beam as a projected image of the rectangular aperture slit 64. Here, an LD pumped solid-state laser by which a continuous-wave beam can be obtained is used as the laser oscillator 56. More specifically, it is desired to use second harmonics (wavelength: 532 nm), (wavelength: 355 nm) or fourth harmonics (wavelength: 266 nm) of an LD pumped continuous-wave YAG laser or an LD pumped continuous-wave $YVO_4$ laser. Of them, the second harmonics are the most suitable in terms of the magnitude and stability of output.

While the substrate 33 is annealed in the drive circuit portion annealing chamber 15, another substrate is picked up from the cassette 1 by the transfer robot 6, moved in the travel area 7, and mounted into the load lock chamber 9. The substrate mounted in the load lock chamber 9 is passed through the gate valve 8, moved through the conveyance chamber 10, passed through the gate valve 12, and mounted on the stage 32 in the pixel portion annealing chamber 13. Then, of the substrate, at least a pixel portion is irradiated with an LD pumped solid-state pulsed laser beam as described previously.

A region (peripheral circuit portion) where a peripheral circuit including a drive circuit will be formed is irradiated with the time-modulated LD pumped continuous-wave laser beam 65. After that, the substrate 33 is passed through the gate valve 16, the conveyance chamber 10 and the gate valve 8 so as to return to the load lock chamber 9. The transfer robot 6 picks up the substrate 33 from the load lock chamber 9. The substrate 33 is moved in the travel area 7, and received in a cassette (for example, cassette 4) for receiving processed substrates. After that, the substrate subjected to processing in the pixel portion annealing chamber 13 is conveyed into the drive circuit portion annealing chamber 15 or 17, while another fresh substrate is conveyed into the pixel portion annealing chamber 13. Thus, anneal processing in the pixel portion annealing chamber 13 and anneal processing in the drive circuit portion annealing chamber 15 or 17 are performed in parallel.

Incidentally, in the embodiment shown in FIGS. 1 to 5, one pixel portion annealing chamber and two drive circuit portion annealing chambers are arranged on the assumption that the ratio of the throughput of pixel portion annealing (pixel region annealing) to that of drive circuit portion annealing (peripheral circuit portion annealing) is 2:1. However, the present invention is not limited to such a configuration. It is essential to handle annealing of the pixel portion and annealing of the drive circuit portion in parallel. The number of annealing chambers for each annealing may be optimized in accordance with the throughput of the annealing.

Figure 6:
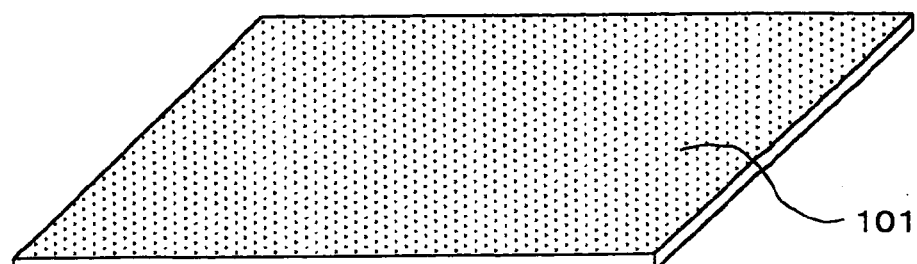
FIGS. 6A–6C are perspective views of a substrate for explaining a sequence of steps of a laser annealing method in the first embodiment of the method for manufacturing a display panel according to the present invention.
Figure 6:
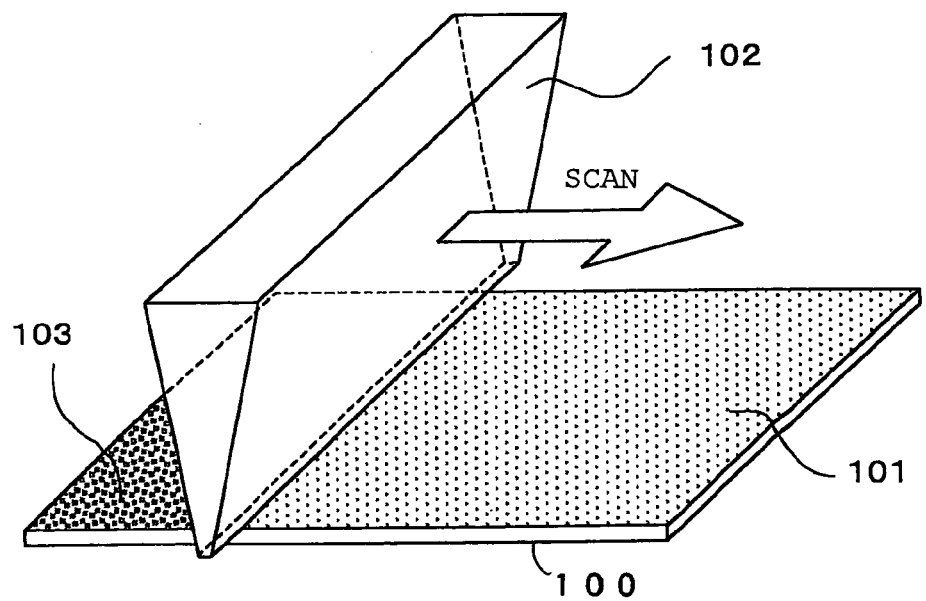
Figure 6:
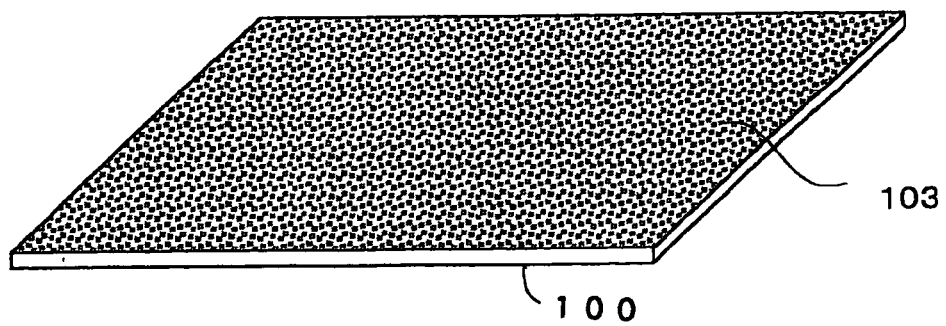

An embodiment of a method for manufacturing a display panel according to the present invention using a laser annealing method using the aforementioned laser annealing apparatus will be described below with reference to FIGS. 6A–6C and 7D–7F as well as FIGS. 1 to 5. FIGS. 6A–6C and 7D–7F are perspective views of a substrate for explaining a sequence of steps of the laser annealing method in the first embodiment of the method for manufacturing a display panel according to the present invention. Steps in FIGS. 6A–6C are followed by steps in FIGS. 7D–7F. The manufacturing method in this embodiment is aimed at a panel in which an amorphous silicon thin film 101 is formed on a glass substrate 100 through an insulating film (not shown) as shown in FIG. 6A. Typically a plurality of panels is formed in one large-size parent substrate. For example, a panel for use in portable telephone or the like has a size of a nominal 1.5–3 type (1.5–3 inches wide across corners in the pixel portion), and several hundreds of panels are formed in a parent substrate about 1 m square. Since it is not practical to express all the panels, FIGS. 6A–6C and 7D–7F show one panel representatively.

As described previously, the glass substrate 100 in which the amorphous silicon thin film 101 30–150 nm thick has been formed in the outermost surface is conveyed into the pixel portion annealing chamber 13, and aligned using an alignment mark (not shown) in accordance with necessity. After that, the whole surface of the glass substrate 100 is scanned and irradiated with an LD pumped Q-switch-pulsed solid-state laser beam 102, more specifically second harmonics of an LD pumped Q-switch-pulsed YAG laser or second harmonics of an LD pumped Q-switch-pulsed YVO$_4$ laser condensed linearly as shown in FIG. 6B.

In this event, the LD pumped Q-switch-pulsed solid-state laser beam 102 repeats displacement and irradiation alternately at a pitch 1/5 to 1/20 as wide as the width of the condensed linear laser beam so that 5 to 20 pulses of the laser beam are applied to each place. The laser beam may be applied whenever the stage 32 (FIG. 2) moved continuously travels 1/5 to 1/20 of the width of the condensed linear laser beam. Alternatively the following operation maybe repeated. That is, 5 to 20 pulses are applied in the state where the stage is stopped. After that, the stage is moved by the condensed width of the linear laser beam. Due to the laser irradiation, the amorphous silicon thin film 101 is subjected to a process of fusion and re-solidification. Thus, the amorphous silicon thin film 101 is transformed into a fine poly-crystalline silicon thin film 103 whose grain size is not larger than 1 micron (μm), typically 200–500 nm.

That is, as shown in FIG. 6C, the whole surface of the amorphous silicon thin film 101 on the glass substrate 100 is trans formed into a fine poly-crystalline silicon thin film 103. The mobility of the silicon film obtained thus is typically about several tens to 100 cm$^2$/Vs, and protrusions are formed in the annealed surface, particularly in the grain boundary, so that irregularities 30–70 nm high are produced. However, since the film has enough performance to form transistors for switching pixels, the irregularities have no particular trouble.

As described previously, the glass substrate 100 as a parent substrate is 1 m square or larger. Therefore, there may be a case that the whole surface of the glass substrate 100 cannot be annealed in one scanning in spite of concurrent irradiation with two pieces of optics installed as shown in FIG. 1. In such a case, the glass substrate 100 is scanned and irradiated a required number of times. When the glass substrate 100 is divided and irradiated by a plurality of times of scanning or a plurality of pieces of optics, a joint portion may be irradiated with pulses twice as many as pulses in a regular portion or may not be irradiated at all. Thus, the crystal state in the joint portion is different from that in the regular annealed portion, resulting in a change in the properties of a transistor formed in the joint portion. It is therefore desired to make a layout such that any joint portion is out of pixel portion transistor positions.

In the laser annealing apparatus shown in FIG. 1 or 2, two pieces of optics for annealing a pixel portion are installed so that annealing can be performed concurrently at two places. However, the present invention is not limited to such a configuration. Only one optics housing may be installed. Alternatively, many pieces of optics depending on the dimensions of the optics housings 36 and 36' and the dimensions of the glass substrate 100 may be installed. Particularly when small-size panels are annealed, the throughput depends on the number of pieces of optics. It is therefore advantageous that a large number of pieces of optics are mounted. In such a case, the apparatus cost indeed increases, but the throughput is improved.

Figure 7:
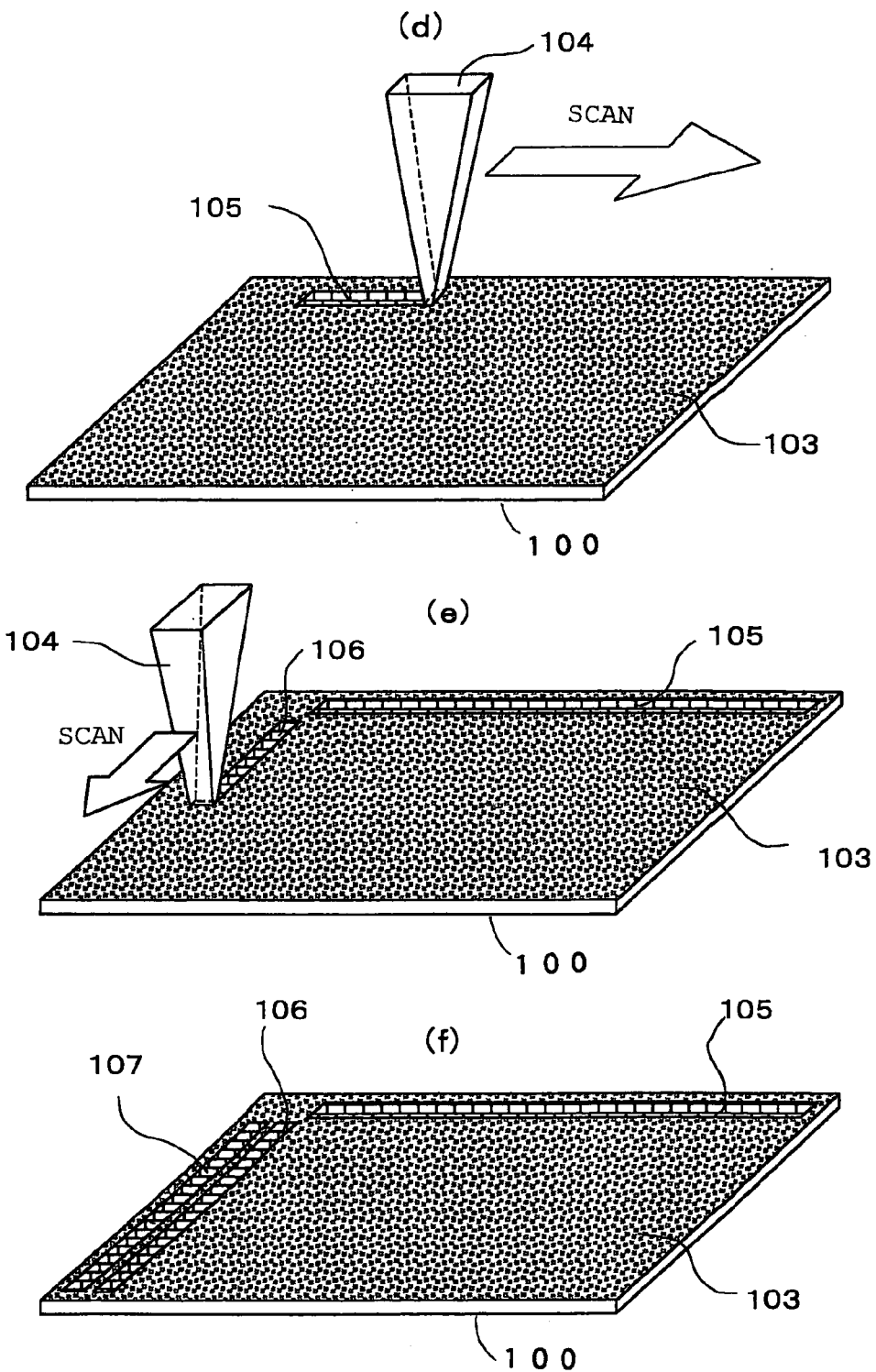
FIGS. 7D–7F are perspective views of the substrate for explaining a sequence of steps of the laser annealing method in the first embodiment of the method for manufacturing a display panel according to the present invention, the steps in FIGS. 7D–7F following the steps in FIGS. 6A–6C.

Next, the glass substrate 100 is conveyed into the drive circuit portion annealing chamber 15 (or 17), and aligned by an alignment mark. After that, first, as shown in FIG. 7D, a signal line drive circuit portion 105 of a peripheral circuit portion is irradiated with an LD pumped continuous-wave solid-state laser beam 104, more specifically second harmonics of an LD pumped continuous-wave YAG laser or specifically second harmonics of an LD pumped continuous-wave YVO$_4$ laser. Time modulation (pulsation) by the electro-optical modulator 68 and scanning (movement of the optics housing 55 or movement of the stage 52) are performed in sync. Thus, the positions where transistors of the signal line drive circuit should be formed are irradiated with the laser beam 104 properly. Fused silicon grows up in the scanning direction of the laser beam 104 using crystals in the boundary portion between the fused portion and the poly-crystalline portion as seed crystals when the silicon is solidified again.

Next, as shown in FIG. 7E, time modulation (pulsation) by the electro-optical modulator 68 and scanning (movement of the optics housing 55 or movement of the stage 52) are performed in sync so that a scanning line drive circuit 106 and an interface circuit 107 of the peripheral circuit portion are irradiated with the LD pumped continuous-wave solid-state laser beam 104. Thus, as shown in FIG. 7F, the positions where transistors of the scanning line drive circuit 106 and the interface circuit 107 should be formed are irradiated with the laser beam 104 properly. Fused silicon grows up in the scanning direction of the laser beam 104 using crystals in the boundary portion between the fused portion and the poly-crystalline portion as seed crystals.

Figure 8:
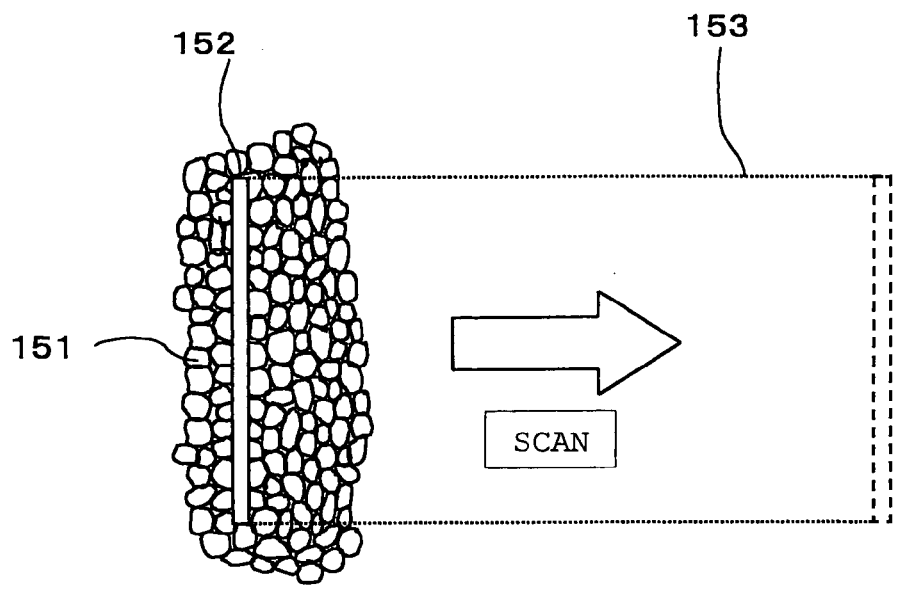
FIGS. 8A–8B are schematic views showing the procedure in which a high-performance transistor is formed out of a poly-crystalline silicon film in the laser annealing method according to the first embodiment of the method for manufacturing a display panel according to the present invention.
Figure 8:
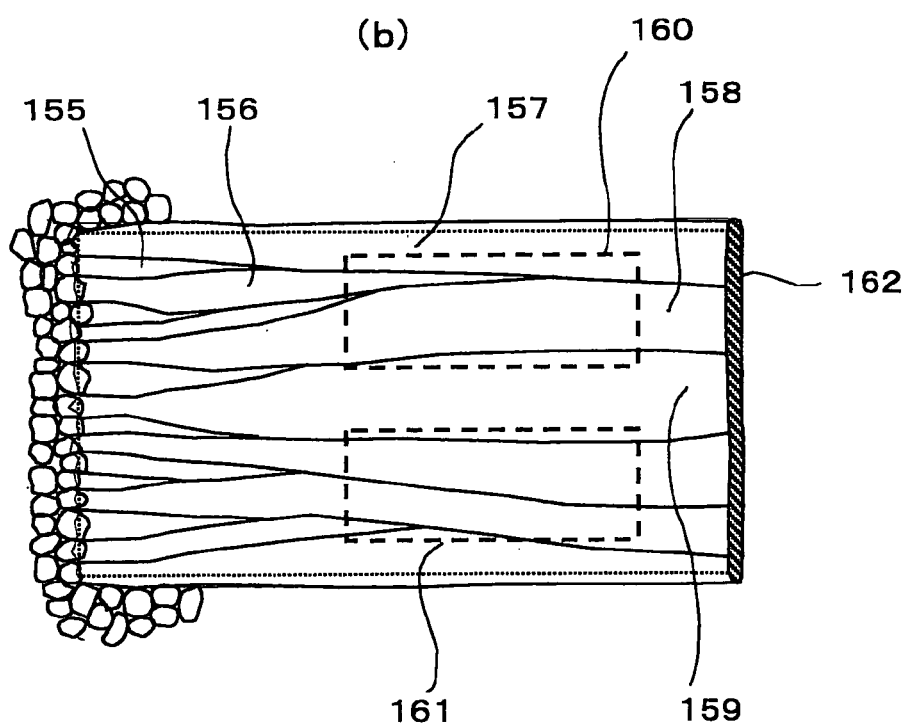

Here, with reference to FIGS. 8A–8B and 9C–9D, description will be made on the behavior of the poly-crystalline silicon thin film irradiated with the time-modulated continuous-wave laser beam. FIGS. 8A–8B and 9C–9D are schematic views showing the procedure in which a high-performance transistor is formed out of a poly-crystalline silicon film in the laser annealing method according to the first embodiment of the method for manufacturing a display panel according to the present invention. As described previously, in this embodiment, annealing is aimed at the substrate in which a poly-crystalline silicon thin film annealed with the solid-state pulsed laser has been formed on the glass substrate 100. A poly-crystalline silicon thin film 151 obtained by annealing with the solid-state pulsed laser is an aggregate of fine crystal grains 151 whose grain size is not larger than 1 micron (several hundreds of nanometers) Incidentally, FIG. 8A shows crystal grains only in a portion (where laser irradiation is initiated) of the poly-crystalline film.

As shown in FIG. 8A, an area 153 where the film quality should be improved is scanned and irradiated with a linearly condensed continuous-wave laser beam 152. Fine crystal grains 120 out of the laser irradiated areas are left as they are, while fine crystal grains in the laser-irradiated areas are fused. After that, as soon as laser irradiation passes away from the area 153, the fused silicon is solidified and recrystallized rapidly. Finally a bulging portion (protrusion portion) 162 is formed, and then annealing this area 153 is terminated. Further, laser irradiation is initiated and terminated repeatedly at a desired interval. That is, block-like laser irradiated areas cover the whole region to be annealed, and then the laser annealing of the peripheral circuit portion is terminated.

In this event, as shown in FIG. 8B, while the crystal grains staying behind in the periphery of the portion where the fusion has been initiated is used as seed crystals, the fused silicon grows into crystals in the scanning direction of the laser beam in accordance with the temperature gradient so that the crystals follow the crystal orientations of the seed crystals respectively. At this time, the growth rate of each crystal grain differs in accordance with its crystal orientation. Therefore, finally only a crystal grain having a crystal orientation whose growth rate is the highest keeps growing. That is, the growth of a crystal grain 155 having a crystal orientation whose growth rate is low is suppressed by the growth of surrounding crystal grains 156 and 157 each having a crystal orientation whose growth rate is higher. Thus, the growth of the crystal grain 155 is stopped.

The crystal grain 156 having a crystal orientation whose growth rate is moderate keeps growing, but the growth of the crystal grain 156 is suppressed by the growth of the crystal grains 157 and 158 whose growth rates are higher. Thus, the growth of the crystal grain 156 is stopped soon. Finally, only a crystal grain having a crystal orientation whose growth rate is the highest keeps growing. However, the crystal grain does not grow unlimitedly. When the crystal grain has grown to be about 5–50 microns long, the growth thereof is suppressed soon by the growth of fresh crystal grains beginning to grow. As a result, a poly-crystalline thin film 0.2–2 microns wide and 5–50 micron long is obtained. Incidentally, the reference numeral 162 represents a protrusion portion.

These crystal grains 157 and 158 going on with their crystal growth are independent crystal grains in the strict sense. However, they have a substantially identical crystal orientation, and their fused and recrystallized portions can be regarded effectively as substantially single crystalline (quasi-single crystalline). In addition, the irregularity in the surface subjected to the laser irradiation is not higher than 10 nm. Thus, the surface is extremely flat. In such a manner, as a result that a poly-crystalline silicon thin film is irradiated with a laser beam, only the portion irradiated with the laser beam is annealed like an island, and only crystal grains each having a specific crystal orientation grow up. Thus, there is formed an area which is indeed poly-crystalline in the strict sense but has properties substantially close to single crystalline properties. Particularly in a direction (crystalline growth direction, that is, laser scanning direction), which does not cross any grain boundary, the area may be regarded as substantially single crystalline (quasi-single crystalline). In this event, a mobility of 300 $cm^2$/Vs or more, typically 450 $cm^2$/Vs, can be obtained as the mobility of the silicon film.

This procedure is repeated while scanning the glass substrate 1 relatively, so that portions to be annealed are irradiated with the laser beam sequentially. Thus, all the areas where transistors of the drive circuit portion should be formed can be converted into areas each having properties close to substantially single crystalline properties. In each area having properties close to single crystalline properties, crystal grains have grown in a fixed direction. Accordingly, when a transistor is formed with the flowing direction (source-drain direction) of a current being brought into line with the growing direction of the crystal grains, it is possible to prevent the current from flowing across any grain boundary.

Figure 9:
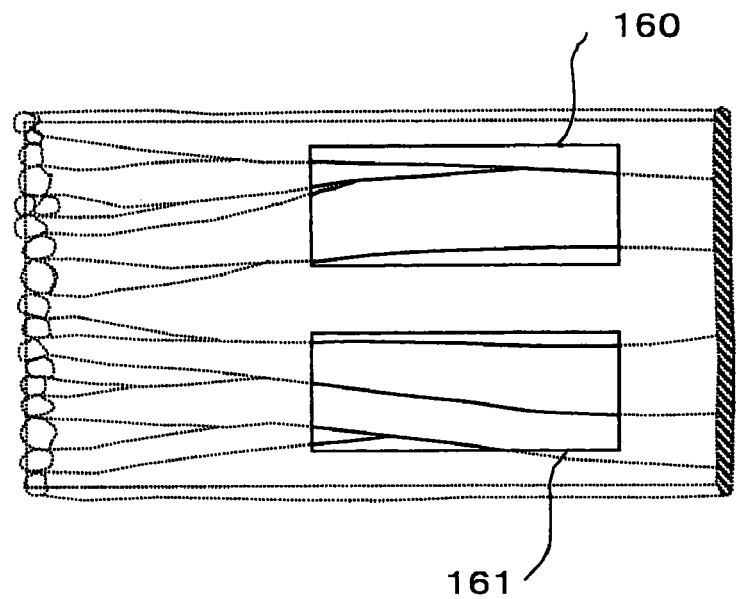
FIGS. 9C–9D are schematic views showing the procedure in which the high-performance transistor is formed out of the poly-crystalline silicon film in the laser annealing method according to the first embodiment of the method for manufacturing a display panel according to the present invention, the procedure in FIGS. 9C–9D following the procedure in FIGS. 8A–8B.
Figure 9:
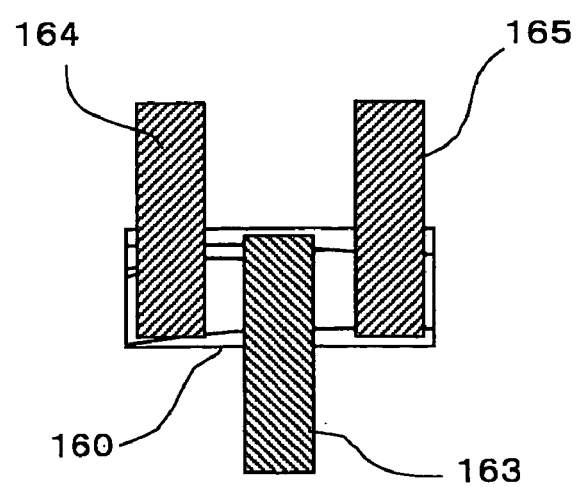

To this end, alignment may be performed so that areas 160 and 161 shown in FIG. 9C correspond to active layers (active regions) of a driving transistor. Any portion other than the active areas 160 and 161 are removed through impurities diffusing step and a photo-etching step. Then, a gate electrode 163 put through a gate insulating film (not shown), and a source electrode 164 and a drain electrode 165 having an ohmic connection are formed in a photoresist step as shown in FIG. 9D. Thus, a transistor is completed. In this case, there are some grain boundaries in the active area 160. However, since a current flows between the source electrode 164 and the drain electrode 165, there is no fear that the current cuts across any grain boundary. Thus, mobility equivalent to that of a transistor formed out of a substantially single crystal (quasi-single crystal) can be obtained.

As described above, the flowing direction of a current is brought into line with a direction not cutting across any grain boundary in the portion fused and recrystallized by irradiation with the time-modulated continuous-wave solid-state laser beam. Thus, the mobility of the portion can be improved to be twice or more times as high as that of a poly-crystalline silicon thin film merely annealed with solid-state pulsed laser. This improved mobility has an enough value to form a peripheral circuit (peripheral circuit region) including a drive circuit for driving liquid crystals at a high speed.

On the other hand, each switching transistor in the pixel portion is formed out of an area of the poly-crystalline silicon thin film 151 merely annealed with the solid-state pulsed laser. A poly-crystalline film obtained by annealing with the solid-state pulsed laser has not only fine crystal grains but also random crystal orientations. Accordingly, the mobility of the poly-crystalline film is indeed lower than that of crystal grains obtained by annealing with the time-modulated continuous-wave solid-state laser, but it is sufficient to be used for a switching transistor in the pixel portion.

Here, as for the procedure to anneal a peripheral circuit portion including a drive circuit, description has been made on the case where a signal line drive circuit portion is annealed first. However, quite the same result can be obtained if a scanning line drive circuit portion is annealed first. The same thing can be applied to other embodiments, which will be described later. In such a manner, as shown in FIG. 7F, a large-grain-size poly-crystalline silicon thin film (also referred to as quasi-single crystalline thin film because performance effectively as high as a single crystalline thin film can be obtained) is formed in the region where the signal line drive circuit 105, the scanning line drive circuit 106, and a high speed circuit or the interface circuit 107 in accordance with necessity should be formed. In addition, a poly-crystalline silicon thin film which does not have very high performance represented by mobility but has a uniform grain size is formed in the region other than the region where the signal line drive circuit 105, the scanning line drive circuit 106, and a high speed circuit or the interface circuit 107 in accordance with necessity should be formed.

Incidentally, to irradiate the scanning line drive circuit 106 and the interface circuit 107 with the laser beam 104 in FIG. 7E, the glass substrate 100 is rotated at an angle of 90 degrees in accordance with necessity. Alternatively, the longitudinal direction of the laser beam 104 condensed linearly is rotated at an angle of 90 degrees and the scanning direction thereof is changed at an angle of 90 degrees. In this case, the direction of crystal grains growing by laser annealing in the signal line drive circuit portion 105 differs from that in the scanning line drive circuit portion 106 and the high-speed circuit or the interface circuit 107 by the angle of 90 degrees. Thus, it is necessary to make a layout such that the growing direction of crystal grains coincides with the source-drain direction of the transistor. In addition, it is necessary to make a layout such that the protrusion portion produced finally in the laser-irradiated region is prevented from overlapping with the transistor region.

In the laser annealing apparatus shown in FIG. 1, two pieces of optics for annealing a peripheral circuit portion including a drive circuit are installed so that two panels can be annealed concurrently. However, the present invention is not limited to such a configuration. Many pieces of optics depending on the dimensions of the optics housings 55 and 55' and the dimensions of the glass substrate 100 may be installed. Particularly when small-size panels are annealed, the throughput depends on the number of pieces of optics. It is therefore advantageous that a large number of pieces of optics are mounted to improve the throughput.

According to the laser annealing method described in the aforementioned embodiment, uniform fine poly-crystalline silicon is formed in the pixel portion only by the solid-state pulsed laser beam 102. Thus, a silicon thin film having a mobility of several tens to 100 $cm^2$/Vs and satisfactory performance for switching pixels can be obtained stably. On the other hand, in the peripheral circuit portion including a drive circuit, annealed with the time-modulated continuous-wave solid-state laser beam 104, a poly-crystalline silicon thin film is formed growing up largely in the scanning direction of the laser beam. Thus, a high-performance silicon thin film having a mobility of 300 $cm^2$/Vs or higher, typically about 450 $cm^2$/Vs, so that a high-speed circuit can be formed, can be obtained stably. After all the steps of annealing are terminated, the glass substrate 100 is carried out of the drive circuit portion annealing chamber 15 (or 17), and received into a cassette (for example, cassette 4) for receiving annealed substrates.

Figure 10:
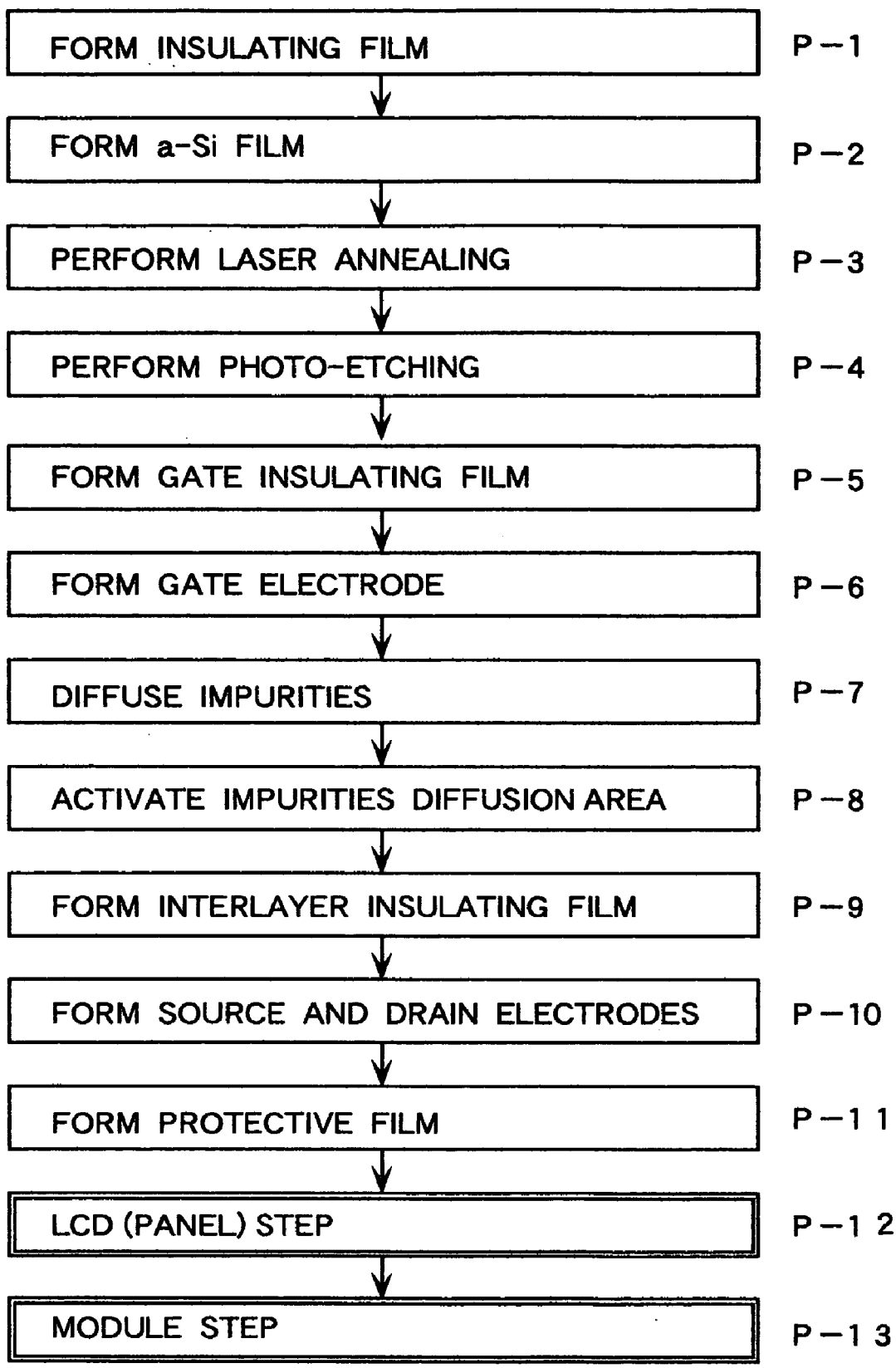
FIG. 10 is a flow chart for explaining the first embodiment of the method for manufacturing a display panel according to the present invention in the order of steps.
Figure 11:
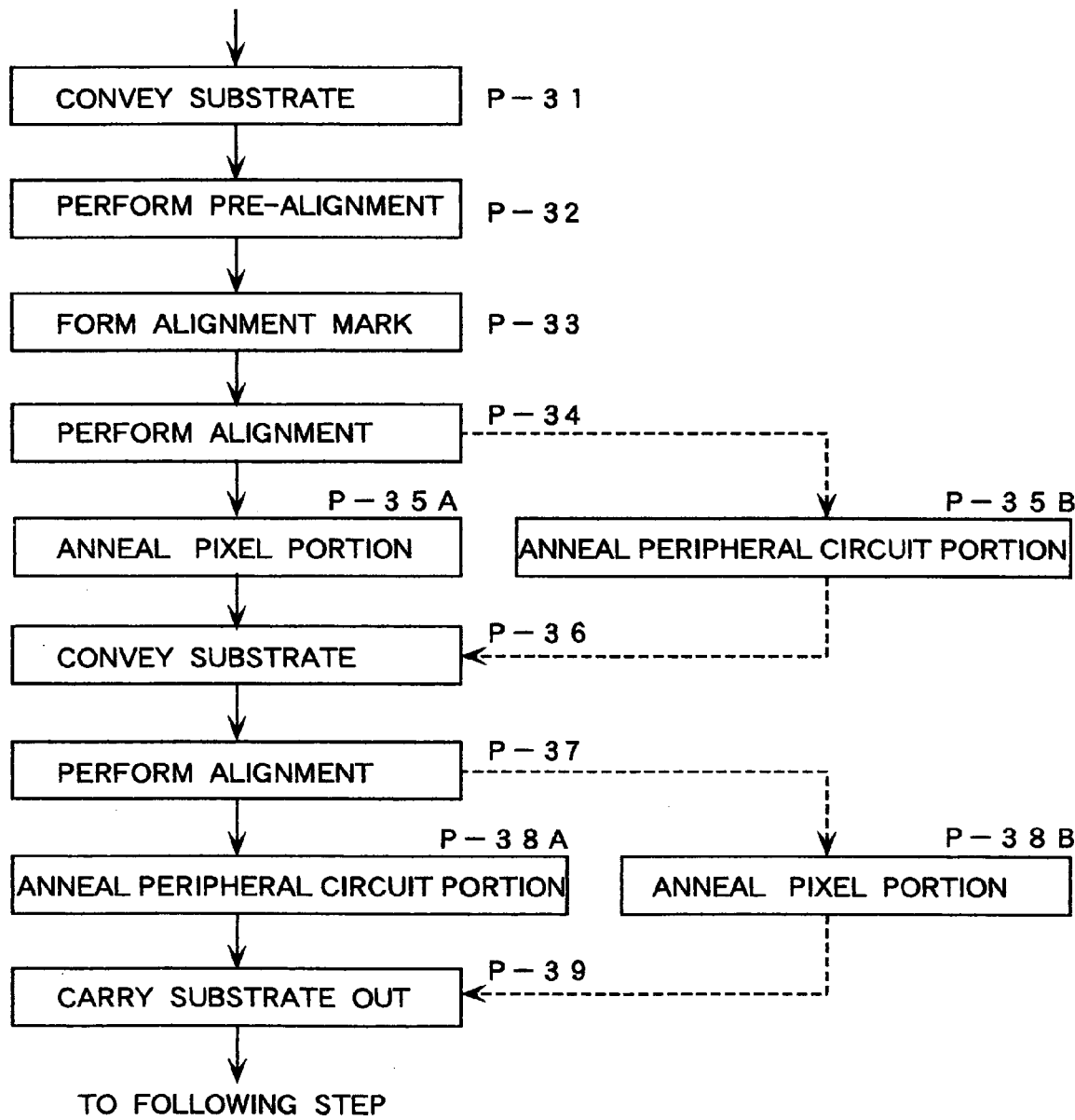
FIG. 11 is a flow chart for explaining the details of a laser annealing step in FIG. 10.
Figure 12:
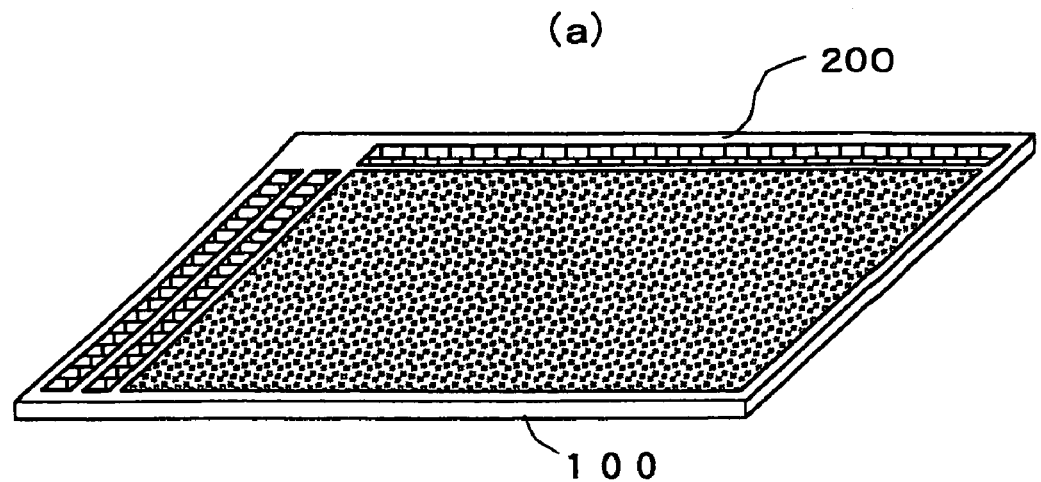
FIGS. 12A to 12C are explanatory views showing the procedure for assembling a TFT substrate completed by the laser annealing applied thereto.
Figure 12:
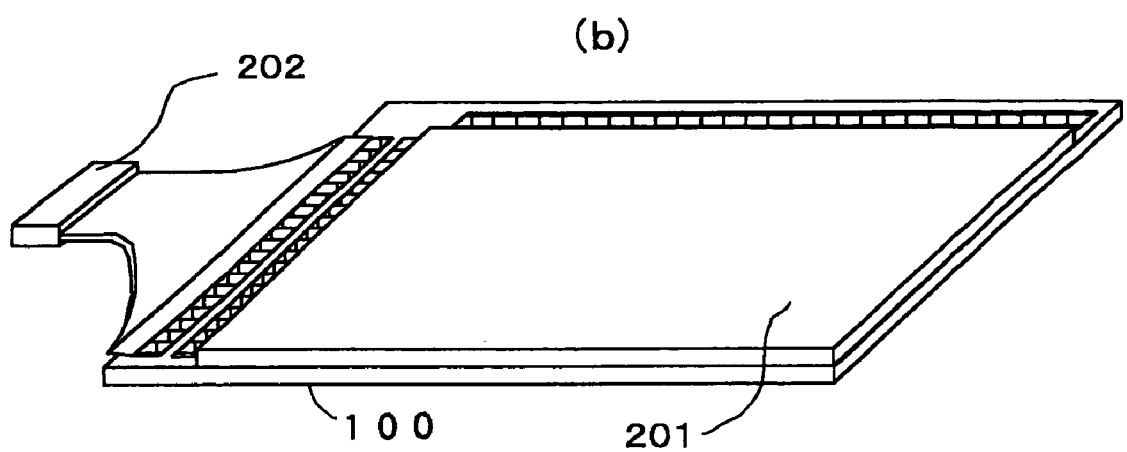
Figure 12:
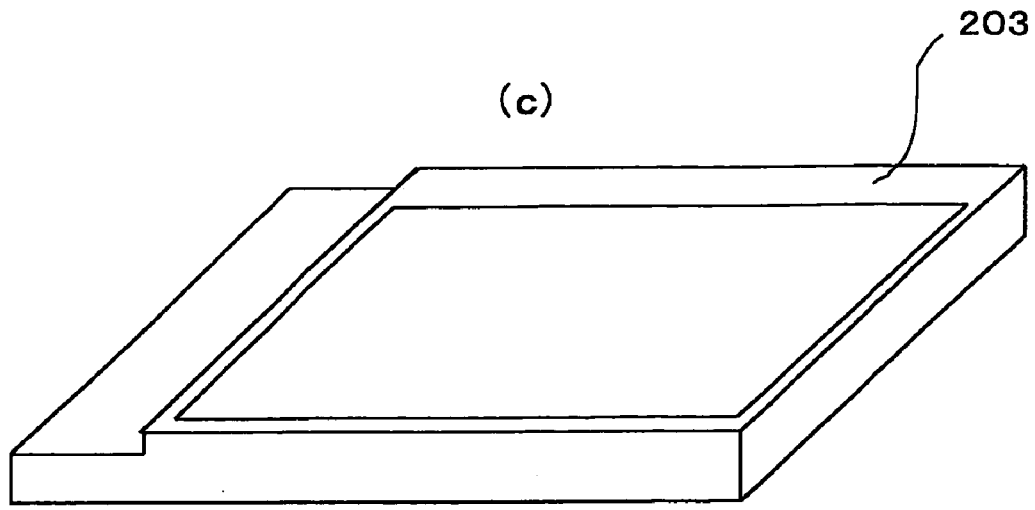

FIG. 10 is a flowchart for explaining the first embodiment of the method for manufacturing a display panel according to the present invention in the order of steps. In addition, FIG. 11 is a flow chart for explaining the details of a laser-annealing step in FIG. 10. Further, FIGS. 12A to 12C are explanatory views showing the procedure for assembling a TFT substrate completed by the laser annealing applied thereto. In FIGS. 10 and 11, each step is referenced by "P". As shown in FIG. 10, first an insulating film is formed on a glass substrate (P-1), and an amorphous silicon (a-Si) film is formed thereon (P-2). The laser annealing (P-3) described in the a forementioned embodiment is performed on the substrate in which the amorphous silicon (a-Si) film has been formed. In the laser annealing in this embodiment, as shown in FIG. 11, the substrate is conveyed into an annealing chamber (P-31) and subjected to pre-alignment (P-32), whereupon an alignment mark is formed (P-33). The alignment mark may be formed by a laser for annealing or by means of inkjet or the like. Alternatively, the alignment mark may be formed in a photo-etching process in advance. In that case, the step (P-33) is dispensable here.

Alignment is performed with the formed alignment mark (P-34). According to the embodiment described previously, the whole surface of the substrate is irradiated with a solid-state pulsed laser beam so that pixel portion annealing for forming a fine poly-crystalline silicon film is applied thereto (P-35A). Next, the substrate is conveyed into a peripheral circuit portion annealing chamber (P-36), and subjected to alignment (P-37) After that, the peripheral circuit portion is irradiated with a time-modulated solid-state continuous-wave laser beam so that crystals are grown up in the scanning direction of the laser beam (P-38A). When required annealing is terminated, the substrate is carried out of the laser annealing apparatus, and sent to the following step (P-39).

After the laser annealing, only parts of the silicon film required for forming transistors are left by the photo-etching step (P-4) in FIG. 10, and a TFT substrate is completed through a gate insulating film forming step (P-5), a gate electrode forming step (P-6), an impurities diffusing step (P-7), an activation step (P-8), an interlayer insulating film forming step (P-9), a source/drain electrode forming step (P-10) and a protective film (passivation film) forming step (P-11).

After that, an orientation film (not shown) is formed on the TFT substrate shown in FIG. 12A, and a final TFT substrate 200 is obtained through a rubbing step. As shown in FIG. 12B, a color filter substrate 201 to be mated with the final TFT substrate 200 is put on top thereof, and an LCD (panel) step (P-12) is carried out. In the LCD (panel) step (P-12), liquid crystals (not shown) are charged between the final TFT substrate 200 and the color filter substrate 201. After a signal and power supply terminal 202 is connected, a module step (P-13) is carried out as shown in FIG. 12C. In the module step (P-13), the final TFT substrate 200 with the color filter substrate 201 is incorporated in a chassis 203 together with a backlight (not shown) and so on. Thus, a liquid crystal display panel (so-called system-on panel) in which a high speed drive circuit and a high speed circuit such as an interface circuit if necessary have been formed on a glass substrate is completed.

Figure 13:
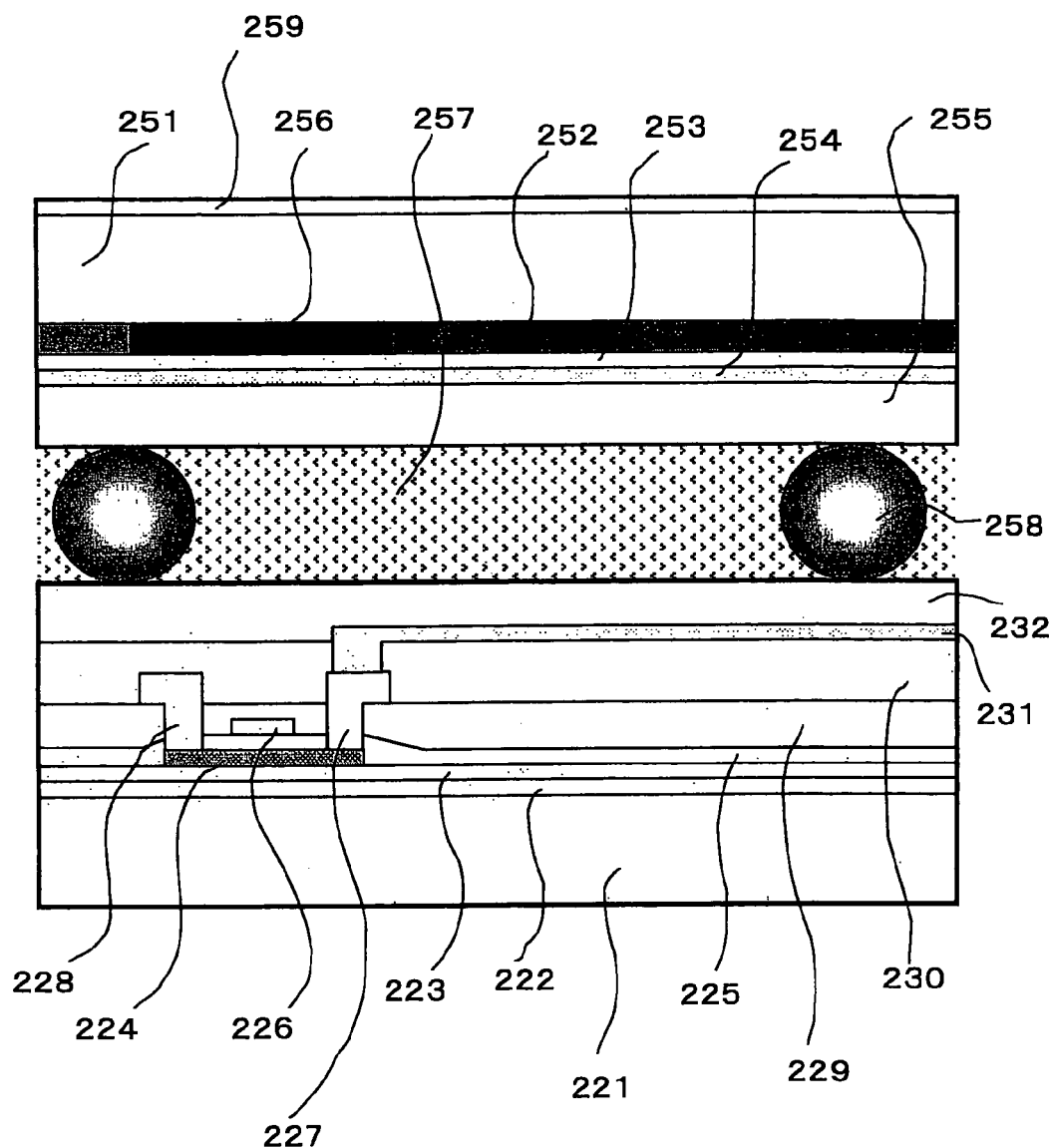
FIG. 13 is a sectional view of a panel in which liquid crystals have been charged between a final TFT substrate and a color filter substrate put on top of each other.

FIG. 13 is a sectional view of the panel in which liquid crystals have been charged between the final TFT substrate 200 and the color filter substrate 201 put on top of each other. That is, an active layer of a transistor is formed out of a silicon layer 224 subjected to laser annealing with a solid-state pulsed laser according to this embodiment. The silicon layer 224 is formed on a glass substrate 221 through an insulating film comprised of a SiN film 222 and a $SiO_2$ film 223. A gate electrode 226 is formed through a gate insulating film 225, and a source electrode 227 and a drain electrode 228 each having an ohmic connection with the silicon film 224 through a through hole are formed on an interlayer insulating film 229. In addition, a transparent pixel electrode 231 is formed on a protective film (passivation film) 230 so as to be connected to the source electrode 227 through a through hole, and an orientation film 232 is formed on the transparent pixel electrode 231 so as to cover the whole surface thereof.

On the other hand, in the color filter substrate, a color filter layer 252 comprised of layers of three colors R (red), G (green) and B (blue) is formed on a glass substrate 251. A transparent electrode 254 is formed thereon through a protective film 253, and an orientation film 255 is formed thereon. A black layer (black matrix layer 256) may be provided in each boundary portion between adjacent layers of the colors R, G and B in the color filter layer 252 in accordance with necessity. Alternatively, a black matrix layer may be provided between the color filter layer 252 and the glass substrate 251.

Liquid crystals 257 are charged between the final TFT substrate and the color filter substrate while a fixed distance is retained between the final TFT substrate and the color filter substrate by beads 258. Instead of the beads 258, column spacers may be formed on the final TFT substrate side or on the color filter substrate side. A polarizing plate 259 is pasted to the outside of the color filter substrate.

Next, a laser annealing method in a second embodiment of a method for manufacturing a display panel according to the present invention will be described with reference to FIGS. 14A–14C, 15D–15F, 16A–16B and 17C–17D as well as FIGS. 1 to 5. FIGS. 14A–14C and 15D–15F are perspective views of a substrate for explaining a sequence of steps of the laser annealing method in the second embodiment of the method for manufacturing a display panel according to the present invention. Steps in FIGS. 14A–14C are followed by steps in FIGS. 15A–15C. The manufacturing method in this embodiment is aimed at a panel in which an amorphous silicon thin film 111 is formed on a glass substrate 100 through an insulating film (not shown) as shown in FIG. 14A. Typically, in the same manner as in the aforementioned embodiment, a plurality of panels is formed in one large-size parent substrate. For example, a panel for use in portable telephone or the like has a size of a nominal 1.5–3 type (1.5–3 inches wide across corners in the pixel portion), and several hundreds of panels are formed in a parent substrate about 1 m square. Since it is not practical to express all the panels, FIGS. 14A–14C and 15D–15F show one panel representatively.

In the same manner as in the first embodiment, the glass substrate 100 is conveyed into the pixel portion annealing chamber 13, and aligned using an alignment mark. After that, only a pixel portion of the substrate 100 is scanned and irradiated with an LD pumped Q-switch-pulsed solid-state laser beam 112, more specifically second harmonics of an LD pumped Q-switch-pulsed YAG laser or second harmonics of an LD pumped Q-switch-pulsed $YVO_4$ laser condensed linearly as shown in FIG. 14B. In this event, the LD pumped Q-switch-pulsed solid-state laser beam 112 repeats displacement and irradiation alternately at a pitch 1/5 to 1/20 as wide as the width of the condensed linear laser beam so that 5 to 20 pulses of the laser beam are applied to each place.

The laser beam may be applied whenever the stage moved continuously travels 1/5 to 1/20 of the width of the condensed linear laser beam. Alternatively the following operation may be repeated. That is, 5 to 20 pulses are applied in the state where the stage is stopped. After that, the stage is moved by the condensed width of the linear laser beam. Due to the laser irradiation, the amorphous silicon thin film 111 is subjected to a process of fusion and re-solidification. Thus, the amorphous silicon thin film 111 is transformed into a fine poly-crystalline silicon thin film 113 having a grain size of 1 micron or smaller, typically 200–500 nm.

That is, as shown in FIG. 14C, of the amorphous silicon thin film 111 on the glass substrate 100, only a portion (pixel region) where pixels should be formed is transformed into a fine poly-crystalline silicon thin film 113. The mobility of the silicon film obtained thus is typically about several tens to 100 $cm^2/Vs$, and protrusions are formed in the annealed surface, particularly in the grain boundary, so that irregularities about 30–70 nm high are produced. However, since the film has enough performance to form transistors for switching pixels, the irregularities have no particular trouble.

Incidentally, to anneal only the pixel portion, the rectangular aperture slit 44 of the optics shown in FIG. 3 may be adjusted to have dimensions corresponding to the pixel portion. Alternatively, if the length of the linearly condensed laser beam can cover pixel portions of a plurality of panels, a mask 48 having a plurality of apertures for adjusting the longitudinal direction of the linearly condensed laser beam to the size of the pixel portions may be inserted in place of the rectangular aperture slit 44. In this case, the pixel portions of the plurality of panels are scanned and irradiated with the laser beam in a lump.

In the laser annealing apparatus shown in FIG. 1 or 2, two pieces of optics for annealing a pixel region so that two panels can be annealed concurrently. However, the present invention is not limited to such a configuration. Only one optics housing may be installed. Alternatively, many pieces of optics housings depending on the dimensions of the optics housings 37 and 37' and the dimensions of the glass substrate 100 maybe installed. Particularly when small-size panels are annealed, the throughput depends on the number of pieces of optics. It is therefore advantageous that a large number of pieces of optics are mounted. In such a case, the apparatus cost indeed increases, but the throughput is improved.

Figure 15:
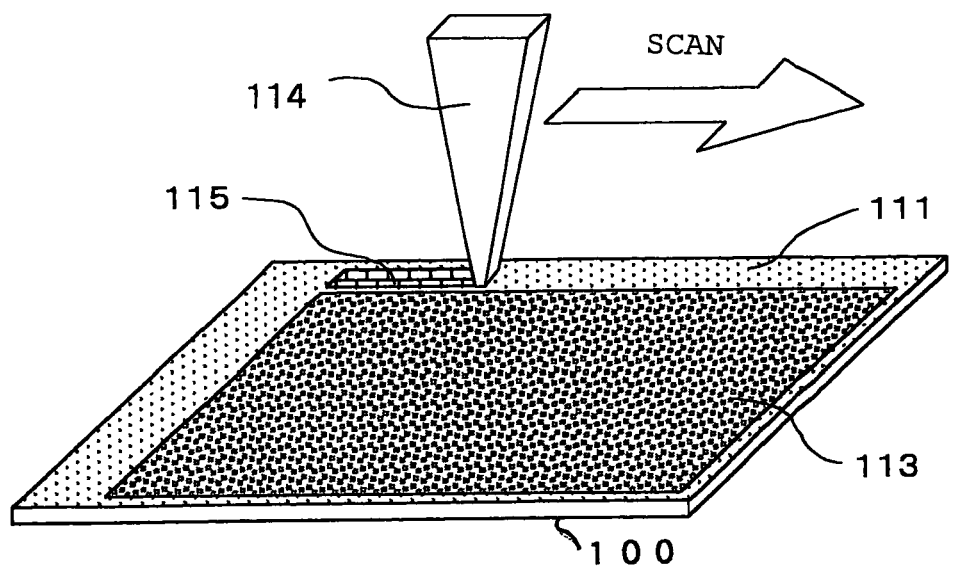
FIGS. 15D–15F are perspective views of the substrate for explaining a sequence of steps of the laser annealing method in the second embodiment of the method for manufacturing a display panel according to the present invention, the steps in FIGS. 15D–15F following the steps in FIGS. 14A–14C.
Figure 15:
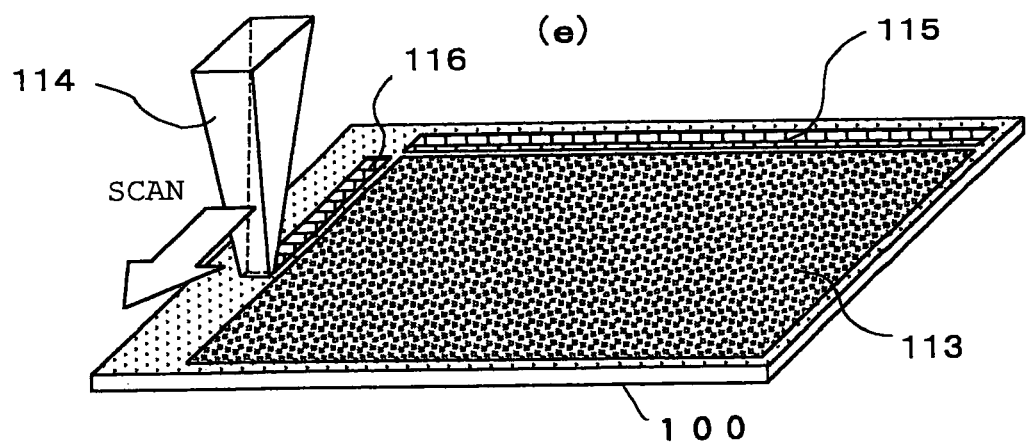
Figure 15:
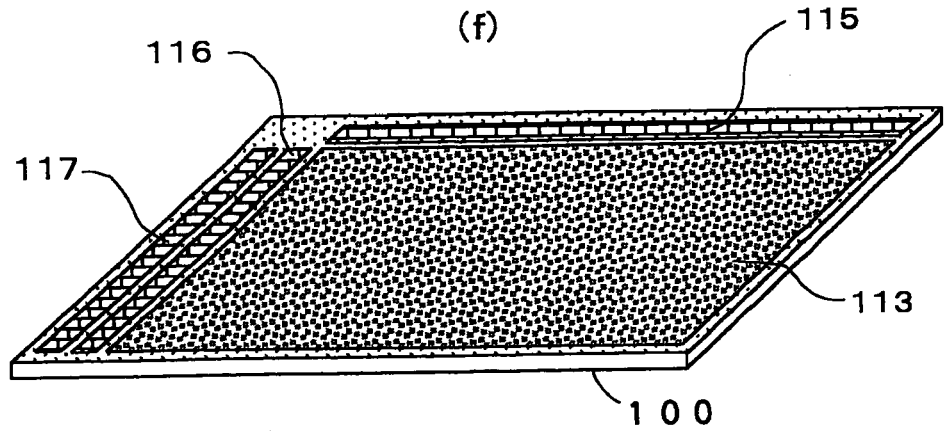

Next, the glass substrate 100 is conveyed into the drive circuit portion annealing chamber 15 (or 17), and aligned by an alignment mark. After that, first, as shown in FIG. 15D, a signal line drive circuit portion 115 of a peripheral circuit portion is irradiated with an LD pumped continuous-wave solid-state laser beam 114, more specifically a second harmonic of an LD pumped continuous-wave YAG laser or a second harmonic of an LD pumped continuous-wave $YVO_4$ laser. Time modulation (pulsation) by the electro-optical modulator 68 and scanning (movement of the optics housing 55 or movement of the stage 52) are performed in sync. Thus, the positions where transistors of the signal line drive circuit should be formed are irradiated with the laser beam 114 properly. Fused silicon grows up in the scanning direction of the laser beam 114 using crystals in the boundary portion of the laser-irradiated area as seed crystals when the fused silicon is solidified again.

Next, as shown in FIG. 15E, time modulation (pulsation) by the electro-optical modulator 68 and scanning (movement of the optics housing 55 or movement of the stage 52) are performed in sync so that a scanning line drive circuit 116 and an interface circuit 117 of the peripheral circuit portion are irradiated with the LD pumped continuous-wave solid-state laser beam 114. Thus, the positions where transistors of the scanning line drive circuit 116 and the interface circuit 117 should be formed are irradiated with the laser beam 114 properly. Fused silicon grows up in the scanning direction of the laser beam 114 using crystals in the boundary portion of the laser-irradiated area as seed crystals when the fused silicon is solidified again.

Figure 16:
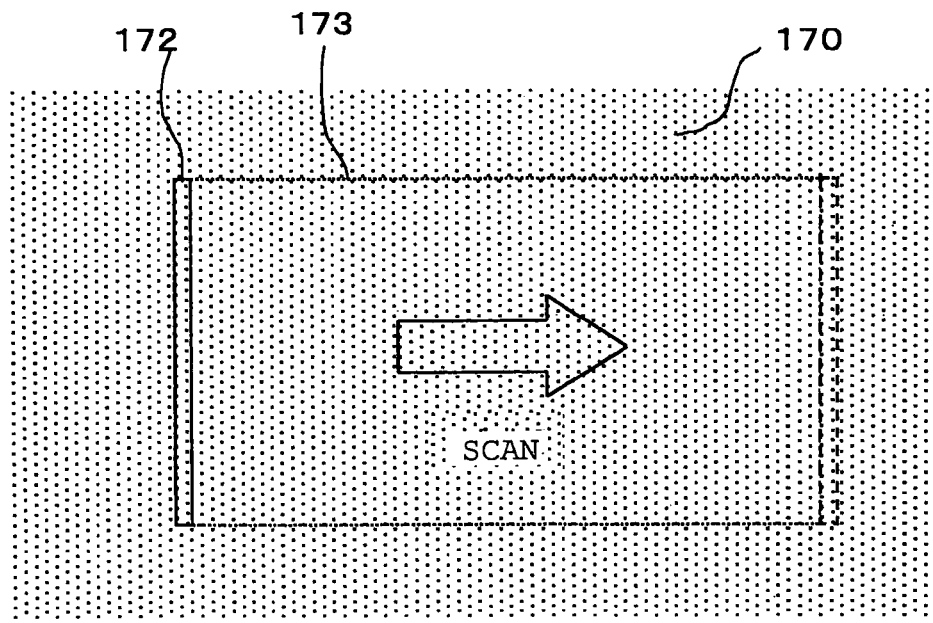
FIGS. 16A–16B are schematic views showing the procedure in which a high-performance transistor is formed out of a poly-crystalline silicon film in the laser annealing method according to the second embodiment of the method for manufacturing a display panel according to the present invention.
Figure 16:
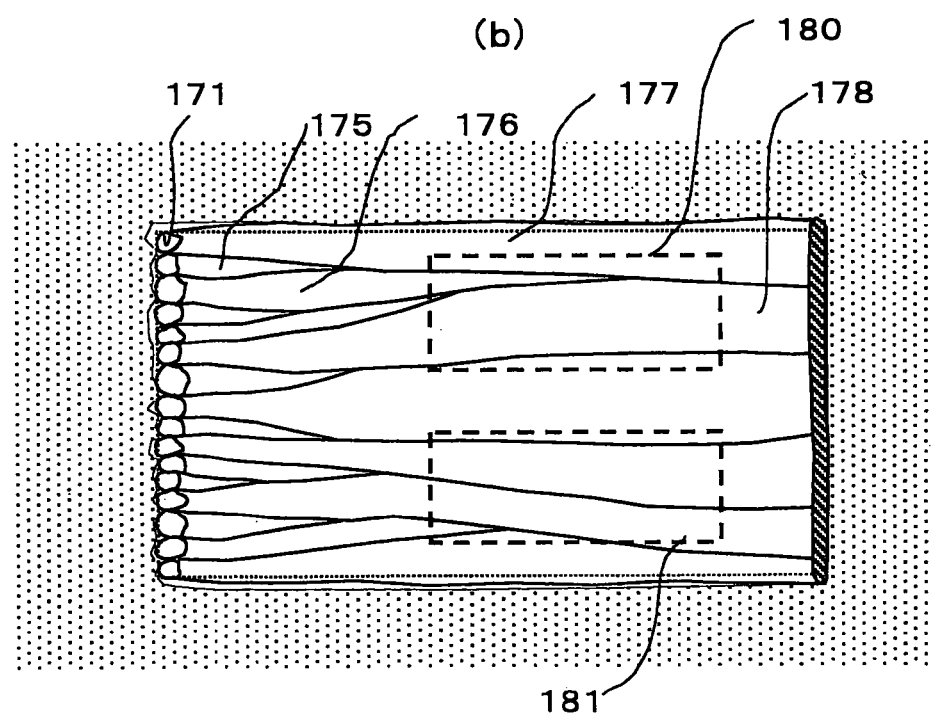

Here, with reference to FIGS. 16A–16B and 17C–17D, description will be made on the behavior of the amorphous silicon thin film irradiated with the time-modulated continuous-wave laser beam. FIGS. 16A–16B and 17C–17D are schematic views showing the procedure in which a high-performance transistor is formed out of a poly-crystalline silicon film in the laser annealing method according to the second embodiment of the method for manufacturing a display panel according to the present invention. As described previously, in this embodiment, annealing is aimed at the substrate in which an amorphous silicon thin film 170 has been formed on a glass substrate. As shown in FIG. 16A, an area 173 is scanned and irradiated with a linearly condensed continuous-wave laser beam 172. The amorphous silicon film 170 out of the laser irradiated area is left as it is, while amorphous silicon in the laser irradiated area is fused. After that, as soon as laser irradiation passes away from the area 173, the fused amorphous silicon is solidified and recrystallized rapidly. Finally a bulging portion (protrusion) is formed, and then annealing this area is terminated. Further, laser irradiation is initiated and terminated repeatedly at a desired interval. That is, block-like laser irradiated areas cover the whole region to be annealed, and then laser annealing of the peripheral circuit portion is terminated.

In this event, as shown in FIG. 16B, the fused silicon is cooled from the periphery of the portion where the fusion has been initiated, so that fine crystal grains (for example, 171) are formed. After that, using the crystal grains as seed crystals, crystals following the crystal orientations of the seed crystals respectively grow up in the scanning direction of the laser beam in accordance with the temperature gradient. At this time, the growth rate of each crystal grain differs in accordance with its crystal orientation. Therefore, finally only a crystal grain having a crystal orientation whose growth rate is the highest keeps growing. That is, the growth of a crystal grain 175 having a crystal orientation whose growth rate is low is suppressed by the growth of surrounding crystal grains 176 and 177 each having a crystal orientation whose growth rate is higher. Thus, the growth of the crystal grain 175 is stopped.

The crystal grain 176 having a crystal orientation whose growth rate is moderate keeps growing, but the growth of the crystal grain 176 is suppressed by the growth of the crystal grains 177 and 178 whose growth rates are higher. Thus, the growth of the crystal grain 176 is stopped soon. Finally, only a crystal grain having a crystal orientation whose growth rate is the highest keeps growing. However, the crystal grain does not grow unlimitedly. When the crystal grain has grown to be about 5–50 microns long, the growth thereof is suppressed soon by the growth of fresh crystal grains beginning to grow. As a result, a poly-crystalline thin film 0.2–2 microns wide and 5–50 microns long is obtained.

These crystal grains 177 and 178 going on with their crystal growth are independent crystal grains in the strict sense. However, they have a substantially identical crystal orientation, and their fused and recrystallized portions can be regarded effectively as substantially single crystalline (quasi-single crystalline). In addition, the irregularity in the surface subjected to the laser irradiation is not higher than 10 nm. Thus, the surface is extremely flat. In such a manner, as a result that a poly-crystalline silicon thin film is irradiated with a laser beam, only the portion irradiated with the laser beam is annealed like an island, and only crystal grains each having a specific crystal orientation grow up. Thus, there is formed an area which is indeed poly-crystalline in the strict sense but has properties substantially close to single crystalline properties. Particularly in a direction that does not cross any grain boundary, that is, in a crystalline growth direction, the area may be regarded as substantially single crystalline (quasi-single crystalline). In this event, a mobility of 300 $cm^2$/Vs or more, typically 450 $cm^2$/Vs, can be obtained as the mobility of the silicon film (quasi-single crystalline silicon film).

This procedure is repeated while scanning the glass substrate relatively, so that portions to be annealed are irradiated with the laser beam sequentially. Thus, all the areas where transistors of the drive circuit portion should be formed can be converted into areas each having properties close to substantially single crystalline properties. In each area having properties close to single crystalline properties, crystal grains have grown in a fixed direction. Accordingly, when a transistor is formed with the flowing direction (source-drain direction) of a current being brought into line with the growing direction of the crystal grains, it is possible to prevent the current from flowing across any grain boundary.

Figure 17:
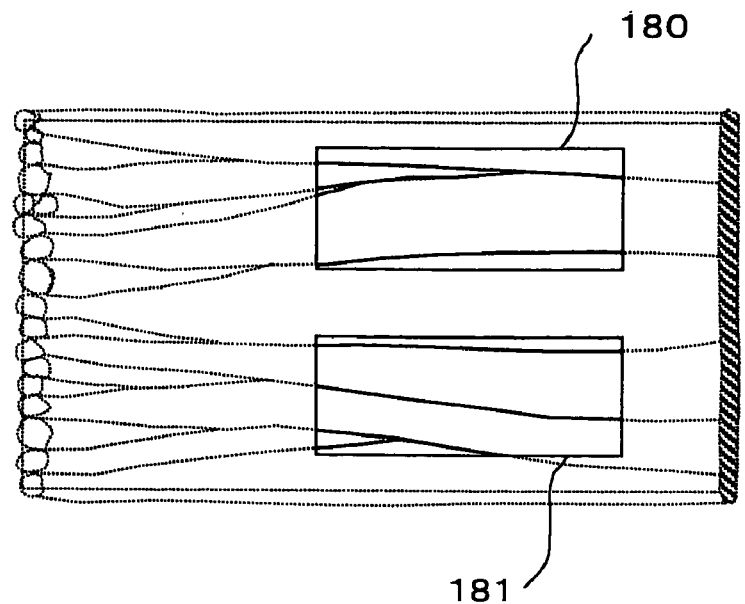
FIGS. 17C–17D are schematic views showing the procedure in which the high-performance transistor is formed out of the poly-crystalline silicon film in the laser annealing method according to the second embodiment of the method for manufacturing a display panel according to the present invention, the procedure in FIGS. 17C–17D following the procedure in FIGS. 16A–16B.
Figure 17:
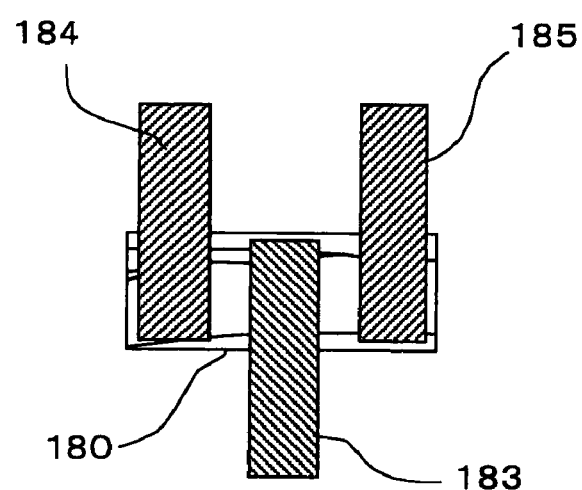

To this end, alignment may be performed so that areas 180 and 181 shown in FIG. 16B correspond to active layers (active regions) of a driving transistor as shown in FIG. 17C. Any portion other than the active areas 180 and 181 are removed through impurities diffusing step and a photo-etching step. Then, a gate electrode 183 put through a gate insulating film, and a source electrode 184 and a drain electrode 185 having an ohmic connection are formed in a photoresist step as shown in FIG. 17D. Thus, a transistor is completed. In this case, there are some grain boundaries in the active area 180. However, since a current flows between the source electrode 184 and the drain electrode 185, there is no fear that the current cuts across any grain boundary. Thus, mobility equivalent to that of a transistor formed out of a substantially single crystal (quasi-single crystal) can be obtained.

As described above, in the portion fused and recrystallized by irradiation with the time-modulated continuous-wave solid-state laser, the flowing direction of a current is brought into line with a direction not cutting across any grain boundary, that is, the growing direction of crystal grains. Thus, a mobility of 300 $cm^2$/Vs or more, typically 450 $cm^2$/Vs, can be obtained as the mobility of the silicon film. This mobility has an enough value to form a peripheral circuit including a drive circuit for driving liquid crystals at a high speed.

In such a manner, as shown in FIG. 15F, a large-grain-size poly-crystalline silicon thin film (also referred to as quasi-single crystalline thin film because performance effectively as high as a single crystalline thin film can be obtained) is formed in the region (peripheral circuit portion) where the signal line drive circuit 115, the scanning line drive circuit 116, and a high speed circuit or the interface circuit 117 in accordance with necessity should be formed. Incidentally, to irradiate the scanning line drive circuit 116 and the interface circuit 117 with the laser beam 114 in FIG. 15E, the glass substrate 100 is rotated at an angle of 90 degrees in accordance with necessity. Alternatively, the longitudinal direction of the laser beam 114 condensed linearly is rotated at an angle of 90 degrees and the scanning direction thereof is changed at an angle of 90 degrees. In this case, the direction of crystal grains growing by laser annealing in the signal line drive circuit portion 115 differs from that in the scanning line drive circuit portion 116 and the high-speed circuit or the interface circuit 117 by the angle of 90 degrees. Thus, it is necessary to make a layout such that the growing direction of crystal grains coincides with the source-drain direction of the transistor. In addition, it is necessary to make a layout such that the protrusion portion produced finally in the laser irradiated area is prevented from overlapping with the transistor region.

In the laser annealing apparatus shown in FIGS. 1 to 5, two pieces of optics for annealing a peripheral circuit portion including a drive circuit are installed so that two panels can be annealed concurrently. However, the present invention is not limited to such a configuration. Many pieces of optics depending on the dimensions of the optics housings 55 and 55' and the dimensions of the glass substrate 100 may be installed. Particularly when small-size panels are annealed, the throughput depends on the number of pieces of optics. It is therefore advantageous that a large number of pieces of optics are mounted to improve the throughput.

According to the aforementioned laser annealing method, uniform fine poly-crystalline silicon is formed in the pixel region as the pixel portion only by the solid-state pulsed laser 112. Thus, a silicon thin film having a mobility of several tens to 100 $cm^2$/Vs and satisfactory performance for switching pixels can be obtained stably. On the other hand, in the peripheral circuit portion including a drive circuit, annealed with the time-modulated continuous-wave solid-state laser beam 114, a poly-crystalline silicon thin film is formed growing up largely in the scanning direction of the laser beam. Thus, a high-performance silicon thin film having a mobility of 300 $cm^2$/Vs or higher, typically about 450 $cm^2$/Vs, so that a high speed circuit can be formed, can be obtained stably.

Particularly in this embodiment, the peripheral circuit portion including the drive circuit is not irradiated with the pulsed laser beam 112, but the amorphous silicon thin film 111 is irradiated directly with the time-modulated continuous-wave laser beam 114. Accordingly, an extra heat history is not added to the peripheral circuit portion including the drive circuit. Thus, a more stable poly-crystalline silicon thin film (quasi-single crystalline silicon film) is formed. After all the steps of annealing is terminated, the glass substrate 100 is carried out of the drive circuit portion annealing chamber 15 (or 17), and received into a cassette (for example, cassette 4) for receiving annealed substrates.

Here, the process for manufacturing a liquid crystal display panel, including the aforementioned annealing step according to the second embodiment, will be described with reference to FIGS. 10 and 11. As shown in FIG. 10, first an insulating film is formed on a glass substrate (P-1), and an amorphous silicon (a-Si) film is formed thereon (P-2). The laser annealing according to this embodiment is performed (P-3). In the laser annealing according to this embodiment, as shown in FIG. 11, the substrate is conveyed into an annealing chamber (P-31) and subjected to pre-alignment (P-32), whereupon an alignment mark is formed (P-33). The alignment mark may be formed by a laser for annealing or by means of inkjet or the like. Alternatively, the alignment mark may be formed in a photo-etching process in advance. In that case, the step (P-33) is dispensable here.

Alignment is performed with the formed alignment mark (P-34). According to this embodiment, only the pixel portion is irradiated with a solid-state pulsed laser beam so that a fine poly-crystalline silicon film is formed (P-35A). The substrate is conveyed into a peripheral circuit portion annealing chamber (P-36), and subjected to alignment (P-37) After that, only the peripheral circuit portion is irradiated with a time-modulated solid-state continuous-wave laser beam so that crystals are grown up in the scanning direction of the laser beam (P-38A). When required annealing is terminated, the substrate is carried out of the laser annealing apparatus (P-39), and sent to the following step.

Figure 14:
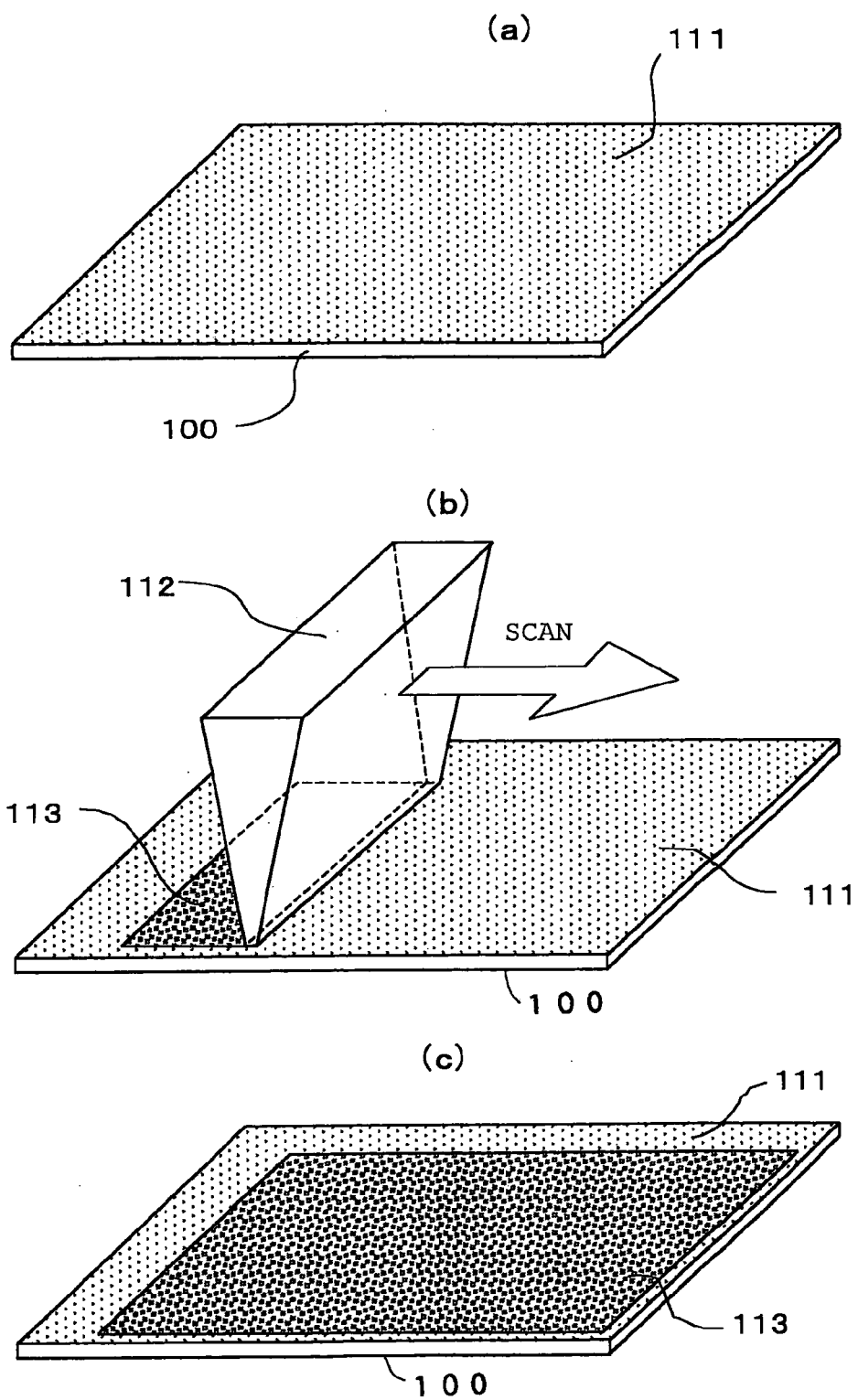
FIGS. 14A–14C are perspective views of a substrate for explaining a sequence of steps of a laser annealing method in a second embodiment of the method for manufacturing a display panel according to the present invention.

After the laser annealing, only parts of the silicon film required for forming transistors are left by the photo-etching step (P-4) in FIG. 10, and a TFT substrate is completed through a gate insulating film forming step (P-5), a gate electrode forming step (P-6), an impurities diffusing step (P-7), an activation step (P-8), an interlayer insulating film forming step (P-9), a source/drain electrode forming step (P-10) and a protective film (passivation film) forming step (P-11). After that, an orientation film is formed on the TFT substrate shown in FIG. 12A, and a final TFT substrate 200 is obtained through a rubbing step. As shown in FIG. 12B, a color filter substrate 201 is put on top of the final TFT substrate 200, and an LCD (panel) step (P-12) is carried out. In the LCD (panel) step (P-12), liquid crystals (liquid crystal material) are charged between the final TFT substrate 200 and the color filter substrate 201. After a signal and power supply terminal 202 is connected, a module step (P-13) is carried out as shown in FIG. 12C. In the module step (P-13), the final TFT substrate 200 with the color filter substrate 201 is incorporated in a chassis 203 together with a backlight (not shown) and so on. Thus, a liquid crystal display panel (so-called system-on panel) in which a high speed drive circuit and a high speed circuit such as an interface circuit if necessary have been formed on a glass substrate is completed. FIG. 14 is a sectional view of the panel in which liquid crystals have been charged between the final TFT substrate and the color filter substrate put on top of each other in such a manner.

Figure 18:
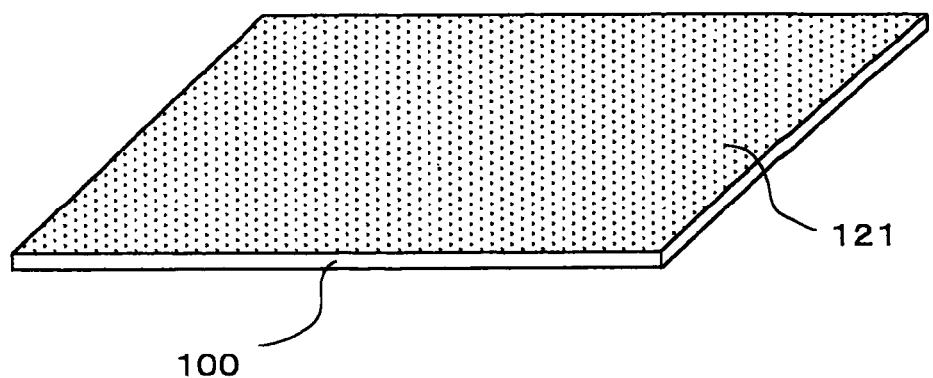
FIGS. 18A–18C are perspective views of a substrate for explaining a sequence of steps of a laser annealing method in a third embodiment of the method for manufacturing a display panel according to the present invention.
Figure 18:
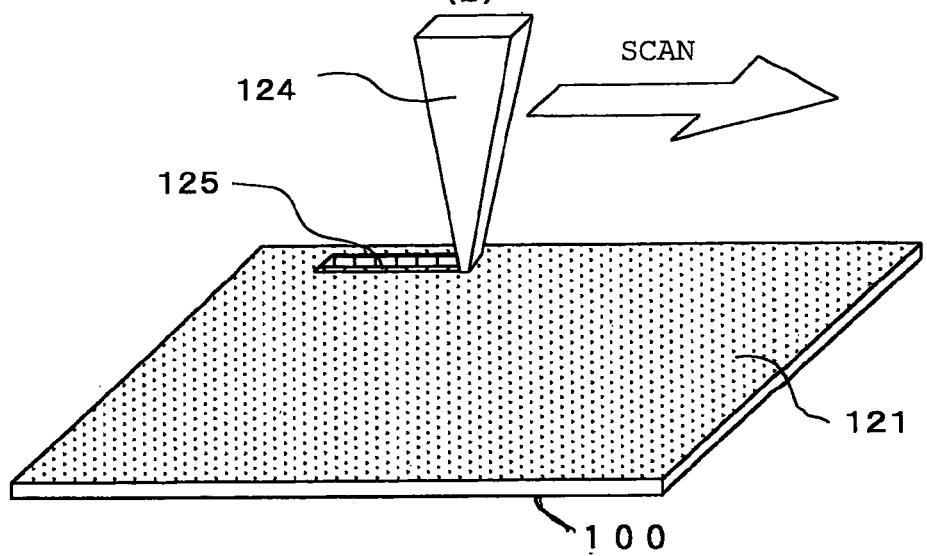
Figure 18:
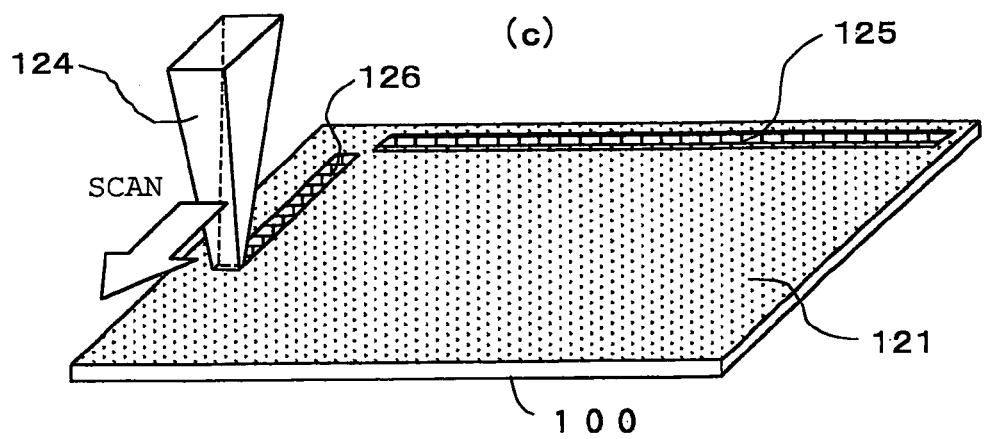

Next, a laser annealing method in a third embodiment of a method for manufacturing a display panel according to the present invention will be described with reference to FIGS. 18A–18C and 19D–19F as well as FIGS. 1 to 5. FIGS. 18A–18C and 19D–19F are perspective views of a substrate for explaining a sequence of steps of the laser annealing method in the third embodiment of the method for manufacturing a display panel according to the present invention. Steps in FIGS. 18A–18C are followed by steps in FIGS. 19A–19C.

This embodiment is aimed at a panel in which an amorphous silicon thin film 121 is formed on a glass substrate 100 through an insulating film (not shown) as shown in FIG. 18A. Typically, a plurality of panels are formed in one parent substrate. For example, a panel for use in portable telephone or the like has a size of a nominal 1.5–3 type (1.5–3 inches wide across corners in the pixel portion), and several hundreds of panels are formed in a parent substrate about 1 m square. Since it is not practical to express all the panels, FIGS. 18A–18C and 19D–19F show one panel representatively.

As described previously, the glass substrate 100 in which the amorphous silicon thin film 121 30–150 nm thick has been formed in the outermost surface is conveyed into the drive circuit portion annealing chamber 15 (or 17), and aligned by an alignment mark. After that, first, as shown in FIG. 18B, a signal line drive circuit portion 125 of a peripheral circuit portion is irradiated with an LD pumped continuous-wave solid-state laser beam 124, more specifically a second harmonic of an LD pumped continuous-wave YAG laser or a second harmonic of an LD pumped continuous-wave $YVO_4$ laser. Time modulation (pulsation) by the electro-optical modulator 68 and scanning (movement of the optics housing 55 or movement of the stage 52) are performed in sync.

Thus, the positions where transistors of the signal line drive circuit should be formed are irradiated with the laser beam 124 properly, so that the amorphous silicon is fused. Of the fused silicon, a boundary portion of the laser-irradiated area opposite to the scanning direction begins to be solidified again so as to form poly-crystals. Using the poly-crystals as seed crystals, crystal grains grow up in the scanning direction of the laser beam.

Next, as shown in FIG. 18C, time modulation (pulsation) by the electro-optical modulator 68 and scanning (movement of the optics housing 55 or movement of the stage 52) are performed in sync so that a scanning line drive circuit 126 and an interface circuit 127 (FIGS. 19D–19F) of the peripheral circuit portion are irradiated with the LD pumped continuous-wave solid-state laser beam 124. Thus, the positions where transistors of the scanning line drive circuit 126 and the interface circuit 127 should be formed are irradiated with the laser beam 124 properly, so that the amorphous silicon is fused. Of the fused silicon, a boundary portion of the laser-irradiated area opposite to the scanning direction begins to be solidified again so as to form poly-crystals. Using the poly-crystals as seed crystals, crystal grains grow up in the scanning direction of the laser beam.

Here, with reference to FIGS. 16A–16B, description will be made on the behavior of the amorphous silicon thin film irradiated with the time-modulated continuous-wave laser beam. As described previously, in this embodiment, annealing is aimed at the substrate in which an amorphous silicon thin film 170 has been formed on the glass substrate 100. As shown in FIG. 16A, an area 173 is scanned and irradiated with a linearly condensed continuous-wave laser beam 172. The amorphous silicon film 170 out of the laser irradiated area is left as it is, while amorphous silicon in the laser irradiated area is fused. After that, as soon as laser irradiation passes away from the area 173, the fused amorphous silicon is solidified and recrystallized rapidly. Finally a bulging portion (protrusion) is formed, and then annealing this area is terminated. Further, laser irradiation is initiated and terminated repeatedly at a desired interval. That is, block-like laser irradiated areas cover the whole region to be annealed, and then laser annealing of the peripheral circuit portion is terminated.

In this event, as shown in FIG. 16B, the fused silicon is cooled from the periphery of the portion where the fusion has been initiated, so that fine crystal grains (for example, 171) are formed. After that, using the crystal grains as seed crystals, crystals following the crystal orientations of the seed crystals respectively grow up in the scanning direction of the laser beam in accordance with the temperature gradient. At this time, the growth rate of each crystal grain differs in accordance with its crystal orientation. Therefore, finally only a crystal grain having a crystal orientation whose growth rate is the highest keeps growing. That is, the growth of a crystal grain 175 having a crystal orientation whose growth rate is low is suppressed by the growth of surrounding crystal grains 176 and 177 each having a crystal orientation whose growth rate is higher. Thus, the growth of the crystal grain 175 is stopped. The crystal grain 176 having a crystal orientation whose growth rate is moderate keeps growing, but the growth of the crystal grain 176 is suppressed by the growth of the crystal grains 177 and 178 whose growth rates are higher. Thus, the growth of the crystal grain 176 is stopped soon.

Finally, only a crystal grain having a crystal orientation whose growth rate is the highest keeps growing. However, the crystal grain does not grow unlimitedly. When the crystal grain has grown to be about 5–50 microns long, the growth thereof is suppressed soon by the growth of fresh crystal grains beginning to grow. As a result, a poly-crystalline thin film 0.2–2 microns wide and 5–50 microns long is obtained. These crystal grains 177 and 178 going on with their crystal growth are independent crystal grains in the strict sense. However, they have a substantially identical crystal orientation, and their fused and recrystallized portions can be regarded effectively as substantially single crystalline (quasi-single crystalline). In addition, the irregularity in the surface subjected to the laser irradiation is not higher than 10 nm. Thus, the surface is extremely flat. In such a manner, as a result that a poly-crystalline silicon thin film is irradiated with a laser beam, only the portion irradiated with the laser beam is annealed like an island, and only crystal grains each having a specific crystal orientation grow up. Thus, there is formed an area which is indeed poly-crystalline in the strict sense but has properties substantially close to single crystalline properties. Particularly in a direction that does not cross any grain boundary, that is, in the crystalline growth direction, the area may be regarded as substantially single crystalline. In this event, a mobility of 300 $cm^2/Vs$ or more, typically 450 $cm^2/Vs$, can be obtained as the mobility of the silicon film (quasi-single crystalline silicon film).

Figure 19:
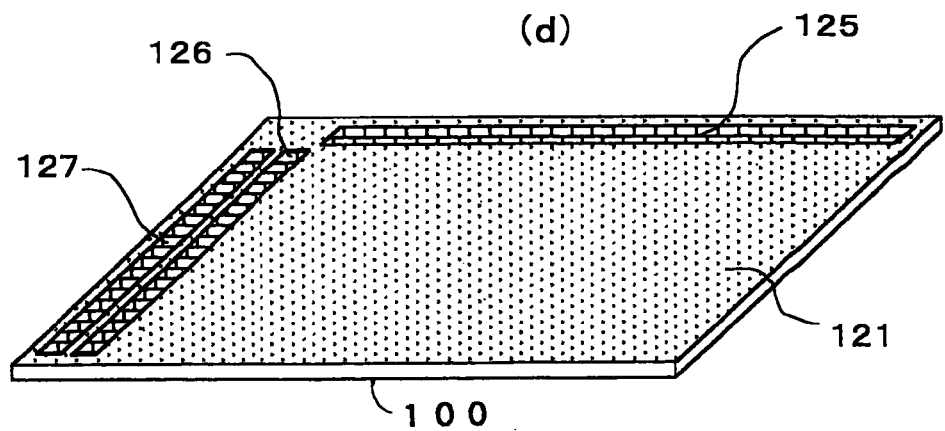
FIGS. 19D–19F are perspective views of the substrate for explaining a sequence of steps of the laser annealing method in the third embodiment of the method for manufacturing a display panel according to the present invention, the steps in FIGS. 19D–19F following the steps in FIGS. 18A–18C.
Figure 19:
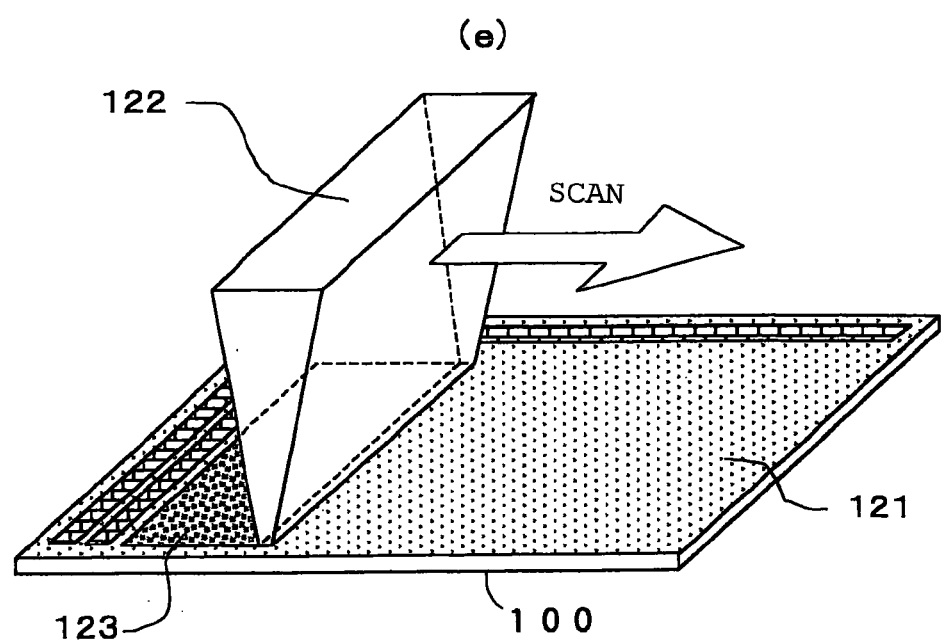
Figure 19:
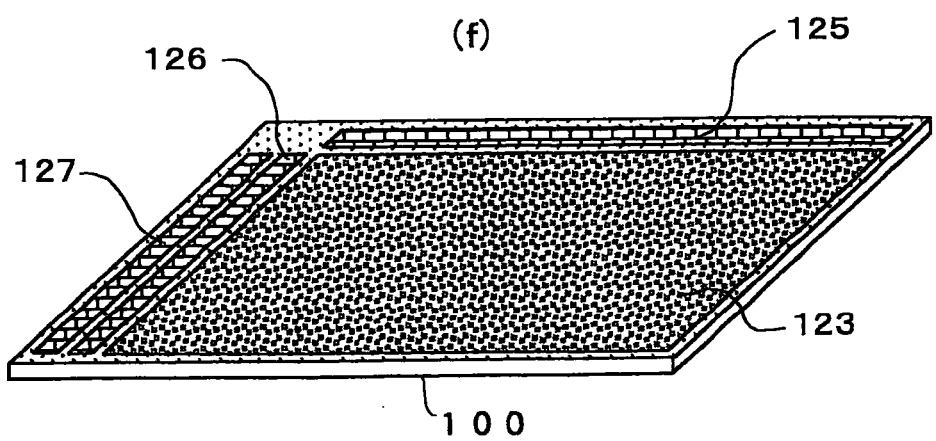

In such a manner, as shown in FIG. 19D, a large-grain-size poly-crystalline silicon thin film (also referred to as quasi-single crystalline thin film because performance effectively as high as a single crystalline thin film can be obtained) is formed in the periphery circuit portion where the signal line drive circuit portion 125, the scanning line drive circuit portion 126, and a high speed circuit or the interface circuit 127 in accordance with necessity should be formed. Incidentally, in FIG. 18C, the direction of crystal grains growing in the signal line drive circuit portion 125 differs from that in the scanning line drive circuit portion 126 and the high speed circuit or the interface circuit 127 by the angle of 90 degrees in accordance with necessity. This can be attained as follows. That is, the glass substrate 100 is rotated at an angle of 90 degrees. Alternatively, the longitudinal direction of the laser beam 124 condensed linearly is rotated at an angle of 90 degrees and the scanning direction thereof is changed at an angle of 90 degrees. In this case, the direction of crystal grains growing by laser annealing in the signal line drive circuit portion 125 differs from that in the scanning line drive circuit portion 126 and the high-speed circuit or the interface circuit 127 by the angle of 90 degrees. Thus, it is necessary to make a layout such that the growing direction of crystal grains coincides with the source-drain direction of the transistor. In addition, it is necessary to make a layout such that the protrusion portion produced finally in the laser-irradiated area is prevented from overlapping with the transistor region.

In the laser annealing apparatus shown in FIG. 1, two pieces of optics for annealing a peripheral circuit portion including a drive circuit are installed so that two panels can be annealed concurrently. However, the present invention is not limited to such a configuration. Many pieces of optics depending on the dimensions of the optics housings 55 and 55' and the dimensions of the glass substrate 100 may be installed. Particularly when small-size panels are annealed, the throughput depends on the number of pieces of optics. It is therefore advantageous that a large number of pieces of optics are mounted to improve the throughput.

Next, the glass substrate 100 is conveyed into the pixel portion annealing chamber 13, and aligned using an alignment mark. After that, only the pixel portion of the substrate 100 is scanned and irradiated with an LD pumped Q-switched pulsed Q-switch-pulsed solid-state laser beam 122, more specifically a second harmonic of an LD pumped Q-switch-pulsed YAG laser or a second harmonic of an LD pumped Q-switch-pulsed $YVO_4$ laser condensed linearly as shown in FIG. 19E.

In this event, the LD pumped Q-switched pulsed solid-state laser beam 122 repeats displacement and irradiation alternately at a pitch 1/5 to 1/20 as wide as the width of the condensed linear laser beam so that 5 to 20 pulses of the laser beam are applied to each place. Alternatively, the following operation may be repeated. That is, 5 to 20 pulses are applied in the state where the stage is stopped. After that, the stage is moved by the condensed width of the linear laser beam. Due to the laser irradiation, the amorphous silicon thin film 121 is subjected to a process of fusion and re-solidification. Thus, the amorphous silicon thin film 121 is transformed into a fine poly-crystalline silicon thin film 123 having a grain size of 1 micron or smaller, typically 200–500 nm.

That is, of the amorphous silicon thin film 121 on the glass substrate, only the portion where pixels should be formed is transformed into the fine poly-crystalline silicon thin film 123 as shown in FIG. 19F. The mobility of the silicon film obtained thus is typically about several tens to 100 $cm^2/Vs$, and protrusions are formed in the annealed surface, particularly in the grain boundary, so that irregularities about 30–70 nm high are produced. However, since the film has enough performance to form transistors for switching pixels, the irregularities have no particular trouble.

Incidentally, to anneal only the pixel portion, the rectangular aperture slit 44 of the optics shown in FIG. 3 may be adjusted to have dimensions corresponding to the pixel portion. Alternatively, if the length of the linearly condensed laser beam can cover pixel portions of a plurality of panels, a mask 48 having a plurality of apertures for adjusting the longitudinal direction of the linearly condensed laser beam to the size of the pixel portions may be inserted in place of the rectangular aperture slit 44. In this case, the pixel portions of the plurality of panels are scanned and irradiated with the laser beam in a lump.

In the laser annealing apparatus shown in FIG. 1 or 2, two pieces of optics for annealing a pixel portion so that two panels can be annealed concurrently. However, the present invention is not limited to such a configuration. Many pieces of optics depending on the dimensions of the optics housings 37 and 37' and the dimensions of the glass substrate 100 may be installed. Particularly when small-size panels are annealed, the throughput depends on the number of pieces of optics. It is therefore advantageous that a large number of pieces of optics are mounted. In such a case, the apparatus cost indeed increases, but the throughput is improved.

According to the aforementioned laser annealing method, uniform fine poly-crystalline silicon is formed in the pixel portion only by the solid-state pulsed laser 122. Thus, a silicon thin film having a mobility of several tens to 100 $cm^2/Vs$ and satisfactory performance for switching pixels can be obtained stably. On the other hand, in the peripheral circuit portion including a drive circuit, annealed with the time-modulated continuous-wave solid-state laser beam 124, a poly-crystalline silicon thin film is formed growing up largely in the scanning direction of the laser beam. Thus, a high-performance silicon thin film having a mobility of 300 $cm^2/Vs$ or higher, typically about 450 $cm^2/Vs$, so that a high speed circuit can be formed, can be obtained stably.

Particularly in this embodiment, the peripheral circuit portion including the drive circuit is not irradiated with the pulsed laser beam 122, but the amorphous silicon thin film 121 is irradiated directly with the time-modulated continuous-wave laser beam 124. Accordingly, an extra heat history is not added to the peripheral circuit portion including the drive circuit. Thus, a more stable poly-crystalline silicon thin film (quasi-single crystalline silicon thin film) is formed. After all the steps of annealing is terminated, the glass substrate 100 is carried out of the drive circuit portion annealing chamber 15 (or 17), and received into a cassette (for example, cassette 4) for receiving annealed substrates.

Here, the process for manufacturing a liquid crystal display panel, including the aforementioned annealing step, will be described with reference to FIGS. 10 and 11. As shown in FIG. 10, first an insulating film is formed on a glass substrate (P-1), and an amorphous silicon (a-Si) film is formed thereon (P-2). The laser annealing according to this embodiment is performed (P-3). In the laser annealing according to this embodiment, as shown in FIG. 11, the substrate is conveyed into an annealing chamber (P-31) and subjected to pre-alignment (P-32), whereupon an alignment mark is formed (P-33). The alignment mark may be formed by a laser for annealing or by means of inkjet or the like. Alternatively, the alignment mark may be formed in a photo-etching process in advance. In that case, the step (P-33) is dispensable here.

Alignment is performed with the formed alignment mark. According to the third embodiment, only the peripheral circuit portion is irradiated with a time-modulated solid-state continuous-wave laser beam so that crystals are grown up in the scanning direction of the laser beam (P-35B). After that, the substrate is conveyed into a pixel portion annealing chamber (p-36) and subjected to alignment (P-37), and only the pixel portion is then irradiated with a solid-state pulsed laser beam so that a fine poly-crystalline silicon film is formed (P-38B) When required annealing is terminated, the substrate is carried out of the laser annealing apparatus (P-39), and sent to the following step.

After the laser annealing, only parts of the silicon film required for forming transistors are left by the photo-etching step (P-4) in FIG. 10, and a TFT substrate is completed through a gate insulating film forming step (P-5), a gate electrode forming step (P-6), an impurities diffusing step (P-7), an activation step (P-8), an interlayer insulating film forming step (P-9), a source/drain electrode forming step (P-10) and a protective film (passivation film) forming step (P-11). After that, an orientation film (not-shown) is formed on the TFT substrate shown in FIG. 12A, and a final TFT substrate 200 is obtained through a rubbing step. As shown in FIG. 12B, a color filter substrate 201 is put on top of the final TFT substrate 200, and an LCD (panel) step (P-12) is carried out. In the LCD (panel) step (P-12), liquid crystals (liquid crystal material) are charged between the final TFT substrate 200 and the color filter substrate 201. After a signal and power supply terminal 202 is connected, a module step (P-13) is carried out as shown in FIG. 12C. In the module step (P-13), the final TFT substrate 200 with the color filter substrate 201 is incorporated in a chassis 203 together with a backlight (not shown) and so on. Thus, a liquid crystal display panel (so-called system-on panel) in which a high-speed drive circuit and a high-speed circuit such as an interface circuit if necessary have been formed on a glass substrate is completed.

FIG. 13 is a sectional view showing the panel in which liquid crystals have been charged between the final TFT substrate and the color filter substrate put on top of each other in such a manner. That is, an active layer of a transistor is formed out of a silicon layer 224 subjected to laser annealing according to the present invention. The silicon layer 224 is formed on a glass substrate 221 through an insulating film comprised of an SiN film 222 and an $SiO_2$ film 223. A gate electrode 226 is formed through a gate insulating film 225, and a source electrode 227 and a drain electrode 228 each having an ohmic connection with the silicon film 224 through a through hole are formed on an interlayer insulating film 229. In addition, a transparent pixel electrode 231 is formed on a protective film (passivation film) 230 so as to be connected to the source electrode 227 through a through hole, and an orientation film 232 is formed on the transparent pixel electrode 231 so as to cover the whole surface thereof.

On the other hand, in the color filter substrate, a color filter layer 252 comprised of layers of three colors R (red), G (green) and B (blue) is formed on a glass substrate 251. A transparent electrode 254 is formed thereon through a protective film 253, and an orientation film 255 is formed thereon. A black layer (black matrix layer 256) may be provided in each boundary portion between adjacent layers of the colors R, G and B in the color filter layer 252 in accordance with necessity. Alternatively, a black matrix layer may be provided between the color filter layer 252 and the glass substrate 251. Liquid crystals 257 are charged between the TFT substrate and the color filter substrate while a fixed distance is retained between the TFT substrate and the color filter substrate by beads 258. Instead of the beads 258, column spacers may be formed on the final TFT substrate side or on the color filter substrate side. A polarizing plate 259 is pasted to the outside of the color filter substrate.

According to the aforementioned embodiments, it is possible to provide a display panel producing properties required for thin film transistors in a pixel region and a peripheral circuit region respectively so as to achieve a high-quality display image, a method for manufacturing the display panel, and an apparatus for manufacturing the display panel. Incidentally, the embodiments of the manufacturing methods can be combined suitably.

As described above, according to the present invention, the pixel region where a pixel portion should be formed is irradiated with only a Q-switch-pulsed solid-state laser beam. Thus, transistors which do not have very high performance represented by mobility but have trued-up properties with performance required for switching pixels, can be formed in the pixel region. On the other hand, the peripheral circuit portion including the drive circuit is irradiated with a time-modulated continuous-wave solid-state laser beam. Thus, a silicon film having crystal grains growing up largely in the scanning direction of the laser beam independently of the history of the silicon film can be obtained. Thus, transistors having performance high enough to form the drive circuit can be formed in the peripheral circuit portion.

All the steps of annealing are performed using a solid-state laser beam as a heat source. Accordingly, the running cost required for performing excimer laser annealing in the background art can be reduced. Further, transistors operating at a high speed can be formed on a glass substrate. Accordingly, an active substrate including a drive circuit, an interface circuit, and so on, that is, a so-called system-on panel (also referred to as "system-in panel") can be realized. Thus, a high-quality display panel using the active substrate can be obtained. In addition, a display panel having a pixel region and a peripheral circuit portion can be provided with the running cost of the manufacturing apparatus being reduced while the throughput is secured.

While we have shown and described several embodiments in accordance with our invention, it should be understood that disclosed embodiments are susceptible of changes and modifications without departing from the scope of the invention. Therefor, we do not intend to be bound by the details shown and described herein but intend to cover all such changes and modifications a fall within the ambit of the appended claims.

We claim:

1. A method for manufacturing a display panel, comprising the steps of:
   mounting an insulating substrate on a stage, said insulating substrate having an amorphous silicon film or a poly-crystalline silicon film formed in a main surface of said insulating substrate, said amorphous or poly-crystalline silicon film including a central portion which should serve as a pixel region having pixel active devices to thereby array a large number of pixels in a matrix, and a portion which is outside said pixel region and which should serve as a peripheral circuit region including a drive circuit portion, having drive portion active devices and disposed in the circumference of said insulating substrate; and
   irradiating the whole surface of said amorphous or poly-crystalline silicon film on said insulating substrate with a solid-state pulsed laser beam, and then irradiating only said peripheral circuit region with a time-modulated solid-state continuous-wave laser beam, so as to apply laser annealing to said amorphous or poly-crystalline silicon film.

2. A method for manufacturing a display panel, comprising the steps of:
   mounting an insulating substrate on a stage, said insulating substrate having an amorphous silicon film or a poly-crystalline silicon film formed in a main surface of said insulating substrate, said amorphous or poly-crystalline silicon film including a central portion which should serve as a pixel region having pixel active devices to thereby array a large number of pixels in a matrix, and a portion which is outside said pixel region and which should serve as a peripheral circuit region including a drive circuit portion, having drive portion active devices and disposed in the circumference of said insulating substrate; and
   irradiating only said pixel region with a solid-state pulsed laser beam, and then irradiating only said peripheral circuit region with a time-modulated solid-state continuous-wave laser beam, so as to apply laser annealing to said amorphous or poly-crystalline silicon film.

3. A method for manufacturing a display panel, comprising the steps of:

mounting an insulating substrate on a stage, said insulating substrate having an amorphous silicon film or a poly-crystalline silicon film formed in a main surface of said insulating substrate, said amorphous or poly-crystalline silicon film including a central portion which should serve as a pixel region having pixel active devices to thereby array a large number of pixels in a matrix, and a portion which is outside said pixel region and which should serve as a peripheral circuit region including a drive circuit portion, having drive portion active devices and disposed in the circumference of said insulating substrate; and irradiating only said periphery circuit region with a time-modulated solid-state continuous-wave laser beam, and then irradiating only a region where said pixel active devices are formed with a solid-state pulsed laser beam, so as to apply laser annealing to said amorphous or poly-crystalline silicon film.

4. A method for manufacturing a display panel according to claim 1, wherein said solid-state pulsed laser beam is harmonics of an LD pumped Q-switch-pulsed YAG laser or harmonics of an LD pumped Q-switch-pulsed $YVO_4$ laser.

5. A method for manufacturing a display panel according to claim 1, wherein said solid-state continuous-wave laser beam is harmonics of an LD pumped continuous-wave YAG laser or harmonics of an LD pumped continuous-wave $YVO_4$ laser.

* * * * *